United States Patent
Lu et al.

(10) Patent No.: US 10,923,491 B2
(45) Date of Patent: *Feb. 16, 2021

(54) HYBRID BONDING CONTACT STRUCTURE OF THREE-DIMENSIONAL MEMORY DEVICE

(71) Applicant: Yangtze Memory Technologies Co., Ltd., Hubei (CN)

(72) Inventors: Zhenyu Lu, Hubei (CN); Simon Shi-Ning Yang, Hubei (CN); Feng Pan, Hubei (CN); Steve Weiyi Yang, Hubei (CN); Jun Chen, Hubei (CN); Guanping Wu, Hubei (CN); Wenguang Shi, Hubei (CN); Weihua Cheng, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/821,757

(22) Filed: Mar. 17, 2020

(65) Prior Publication Data
US 2020/0295025 A1 Sep. 17, 2020

Related U.S. Application Data

(63) Continuation of application No. 16/046,852, filed on Jul. 26, 2018, now Pat. No. 10,593,690, which is a
(Continued)

(30) Foreign Application Priority Data

Mar. 8, 2017 (CN) .......................... 2017 1 0135655

(51) Int. Cl.
*H01L 27/00* (2006.01)
*H01L 27/11575* (2017.01)
(Continued)

(52) U.S. Cl.
CPC .. *H01L 27/11575* (2013.01); *H01L 21/76802* (2013.01); *H01L 21/76877* (2013.01);
(Continued)

(58) Field of Classification Search
None
See application file for complete search history.

(56) References Cited

U.S. PATENT DOCUMENTS

| 8,945,967 B2 | 2/2015 | Wang et al. |
| 9,397,043 B1 | 7/2016 | Minemura |

(Continued)

FOREIGN PATENT DOCUMENTS

| CN | 101162721 A | 4/2008 |
| CN | 102569328 A | 7/2012 |

(Continued)

OTHER PUBLICATIONS

International Search Report and Written Opinion of the International Searching Authority directed to related International Patent Application No. PCT/CN2018/077908, dated May 30, 2018; 8 pages.
(Continued)

*Primary Examiner* — Reema Patel
(74) *Attorney, Agent, or Firm* — Sterne, Kessler, Goldstein & Fox P.L.L.C.

(57) ABSTRACT

Embodiments of through array contact structures of a 3D memory device and fabricating method thereof are disclosed. The memory device includes an alternating layer stack disposed on a first substrate. The alternating layer stack includes a first region including an alternating dielectric stack, and a second region including an alternating conductor/dielectric stack. The memory device further includes a barrier structure extending vertically through the alternating layer stack to laterally separate the first region
(Continued)

from the second region, multiple through array contacts in the first region, each through array contact extending vertically through the alternating dielectric stack, an array interconnection layer in contact with the through array contacts, a peripheral circuit formed on a second substrate. and a peripheral interconnection layer on the peripheral circuit. The array interconnection layer is bonded on the peripheral interconnection layer, such that the peripheral circuit is electrically connected with at least one through array contact.

20 Claims, 15 Drawing Sheets

Related U.S. Application Data continuation of application No. PCT/CN2018/077908, filed on Mar. 2, 2018.

(51) Int. Cl.
| | |
|---|---|
| *H01L 27/11573* | (2017.01) |
| *H01L 27/11582* | (2017.01) |
| *H01L 27/1157* | (2017.01) |
| *H01L 27/11565* | (2017.01) |
| *H01L 21/768* | (2006.01) |
| *H01L 23/522* | (2006.01) |
| *H01L 23/528* | (2006.01) |
| *H01L 23/00* | (2006.01) |
| *H01L 25/18* | (2006.01) |
| *H01L 25/00* | (2006.01) |

(52) U.S. Cl.
CPC ...... *H01L 23/5226* (2013.01); *H01L 23/5283* (2013.01); *H01L 24/03* (2013.01); *H01L 24/08* (2013.01); *H01L 24/89* (2013.01); *H01L 25/18* (2013.01); *H01L 25/50* (2013.01); *H01L 27/1157* (2013.01); *H01L 27/11565* (2013.01); *H01L 27/11573* (2013.01); *H01L 27/11582* (2013.01); *H01L 2224/08146* (2013.01); *H01L 2224/80895* (2013.01); *H01L 2224/80896* (2013.01)

(56) References Cited

U.S. PATENT DOCUMENTS

| | | | |
|---|---|---|---|
| 9,397,046 | B1 | 7/2016 | Sharangpani et al. |
| 9,455,270 | B1 | 9/2016 | Lai |
| 10,038,009 | B2 | 7/2018 | Lim et al. |
| 10,090,315 | B2 | 10/2018 | Fukuzumi et al. |
| 10,593,690 | B2* | 3/2020 | Lu .................. H01L 25/18 |
| 2007/0128787 | A1 | 6/2007 | Higashitani |
| 2008/0087932 | A1 | 4/2008 | Son et al. |
| 2012/0273965 | A1 | 11/2012 | Seo et al. |
| 2013/0126957 | A1 | 5/2013 | Higashitani et al. |
| 2013/0127011 | A1 | 5/2013 | Higashitani et al. |
| 2014/0061750 | A1 | 3/2014 | Kwon et al. |
| 2016/0005481 | A1 | 1/2016 | Hung et al. |
| 2016/0064281 | A1 | 3/2016 | Izumi et al. |
| 2016/0079252 | A1 | 3/2016 | Yamashita |
| 2016/0190154 | A1 | 6/2016 | Nozawa |
| 2017/0170125 | A1* | 6/2017 | Furumoto ......... H01L 21/76843 |
| 2019/0057974 | A1 | 2/2019 | Lu et al. |

FOREIGN PATENT DOCUMENTS

| | | |
|---|---|---|
| CN | 105810638 A | 7/2016 |
| CN | 106129010 A | 11/2016 |
| CN | 106206454 A | 12/2016 |
| CN | 106910746 A | 6/2017 |
| JP | 2011249803 A | 12/2011 |
| JP | 2016062901 A | 4/2016 |
| KR | 1020120121177 A | 6/2016 |
| KR | 1020160069903 A | 6/2017 |
| WO | WO 2016/076955 A1 | 5/2016 |

OTHER PUBLICATIONS

International Preliminary Report on Patentability directed to related International Patent Application No. PCT/CN2018/077908, dated Sep. 10, 2019; 6 pages.

Japanese Application No. 2019-570609, Office Action dated Nov. 2, 2020; English Translation from EPO Global Dossier, 9 pages.

* cited by examiner

HYBRID BONDING CONTACT STRUCTURE OF THREE-DIMENSIONAL MEMORY DEVICE

CROSS-REFERENCE TO RELATED APPLICATIONS

This application is a continuation of application Ser. No. 16/046,852 filed on Jul. 26, 2018, which is a continuation of and claims priority to PCT/CN2018/077908 filed on Mar. 2, 2018, which claims priority to Chinese Patent Application No. 201710135655.3 filed on Mar. 8, 2017, the entire contents of which are incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of through array contact (TAC) structures of 3D memory devices and fabrication methods thereof are disclosed herein.

Disclosed is a three-dimensional (3D) NAND memory device including an alternating layer stack disposed on a first substrate. The alternating layer stack includes a first region including an alternating dielectric stack comprising a plurality of dielectric layer pairs, and a second region including an alternating conductor/dielectric stack comprising a plurality of conductor/dielectric layer pairs. The 3D NAND memory device further includes a barrier structure extending vertically through the alternating layer stack to laterally separate the first region from the second region, a plurality of through array contacts in the first region, each through array contact extending vertically through the alternating dielectric stack, an array interconnection layer in contact with the plurality of through array contacts, a peripheral circuit formed on a second substrate. and a peripheral interconnection layer on the peripheral circuit. The array interconnection layer is bonded on the peripheral interconnection layer, such that the peripheral circuit is electrically connected with at least one of the plurality of through array contacts.

In some embodiments, the array interconnection layer is disposed on the alternating layer stack at an end of the alternating layer stack opposite to the first substrate. In some other embodiments, the array interconnection layer is disposed on a surface of the first substrate that is opposite to the alternating layer stack.

The array interconnection layer includes at least one first interconnection structure embedded in a first dielectric layer. The peripheral interconnection layer includes at least one second interconnection structure embedded in a second dielectric layer. The peripheral circuit is electrically connected with the at least one of the plurality of through array contacts via the at least one first interconnection structure and the at least one second interconnection structure.

The barrier structure comprises silicon oxide and silicon nitride. Each of the plurality of dielectric layer pairs comprises a silicon oxide layer and a silicon nitride layer, and each of the plurality of conductor/dielectric layer pairs comprises a metal layer and a silicon oxide layer. A number of the plurality of dielectric layer pairs is at least 32, and a number of the plurality of conductor/dielectric layer pairs is at least 32.

The 3D NAND memory device further includes a plurality of slit structures each extending vertically through the alternating conductor/dielectric stack and laterally along a word line direction to divide the alternating conductor/dielectric stack into a plurality of memory fingers.

In some embodiments, the barrier structure laterally extends along the word line direction. The first region is separated by the barrier structure from the second region and sandwiched between two neighboring slit structures.

In some embodiments, the barrier structure laterally extends along a bit line direction that is different than the word line direction to laterally separate the first region from the second region. The bit line direction can be perpendicular to the word line direction.

In some embodiments, a width of the first region enclosed by the barrier structure in the bit line direction is larger than a distance between two neighboring slit structures.

In some embodiments, the first region enclosed by the barrier structure is sandwiched between two top selective gate staircase regions in the word line direction. At least top two layers of the alternating conductor/dielectric stack that is away from the first substrate in each top selective gate staircase region have a staircase structure. At least one conductive layer on the staircase structure in the top selective gate staircase regions and configured to interconnect top select gates that are above the alternating conductor/dielectric stack in the second region and on both sides of first region enclosed by the barrier structure in the word line direction. At least two first regions enclosed by corresponding barrier structures, each first region extending parallel along the bit line direction.

The 3D NAND memory device further includes a plurality of barrier structures to enclose a plurality of first regions from the second region, such that the plurality of first regions are aligned in the bit line direction. Each of the plurality of first regions is sandwiched between two neighboring slit structures in the bit line direction. The plurality of first regions are aligned so as to form at least two columns in the bit line direction.

In some embodiments, at least one silt structure, that is sandwiched by two neighboring barrier structures in the bit line direction, includes a gap and the at least one silt structure is configured to interconnect word lines of neighboring ones of the plurality of memory fingers.

In some embodiments, the first region is separated by the barrier structure from a staircase structure on an edge of the alternating conductor/dielectric layer stack along the bit line direction. An opening of the barrier structure is at an edge of the alternating layer stack along the bit line direction. A width of the first region in the bit line direction is larger than a distance between two neighboring slit structures. Alternatively, a width of the first region in the bit line direction is less than a maximum distance between two neighboring slit structures in the staircase structure on the edge of the alternating layer stack along the bit line direction.

The 3D NAND memory device further includes a plurality of dummy channel structures adjacent to the barrier structure, each dummy channel structure extending vertically through the alternating conductor/dielectric stack.

Another aspect of the present disclosure provides a method for forming a three-dimensional (3D) NAND memory device, comprising: forming, on a first substrate, an alternating dielectric stack comprising a plurality of dielectric layer pairs, each of the plurality of dielectric layer pairs comprising a first dielectric layer and a second dielectric layer different from the first dielectric layer; forming at least one barrier structure each extending vertically through the alternating dielectric stack. The at least one barrier structure separates the alternating dielectric stack into at least one first region enclosed laterally by at least the barrier structure, and a second region. The method further includes forming a plurality of slits, and replacing, through the slits, first dielectric layers in the second portion of the alternating dielectric stack with conductor layers to form an alternating conductor/dielectric stack comprising a plurality of conductor/dielectric layer pairs; depositing a conductive material into the slits to form a plurality of slit structures; forming a plurality of through array contacts in the first region, each through array contact extending vertically through the alternating dielectric stack; forming an array interconnection layer in contact with the plurality of through array contacts; and bonding the array interconnection layer to a peripheral interconnection layer on a second substrate, such that at least one of the plurality of through array contacts is electrically connected with a peripheral circuit on the second substrate.

In some embodiments, forming the array interconnection layer comprises forming at least one first interconnection structure in a first dielectric layer that is located on the alternating layer stack at an end of the alternating layer stack opposite to the first substrate. In some other embodiments, forming the array interconnection layer comprises forming at least one first interconnection structure in a first dielectric layer that is located on a surface of the first substrate that is opposite to the alternating layer stack.

The method further includes: prior to bonding the array interconnection layer to the peripheral interconnection layer, forming the peripheral circuit on the second substrate; forming the peripheral interconnection layer on the peripheral circuit, such that at least one second interconnect structure in the peripheral interconnection layer is electrically connected to the peripheral circuit; and disposing the array interconnection layer and the peripheral interconnection layer, such that the at least one first interconnection structure corresponds to the at least one second interconnection structure respectively.

The method further includes, prior to forming the slits, forming a plurality of doped regions in the first substrate, so as to contact each slit structure with a corresponding doped region.

The method further includes forming the plurality of slit structures laterally to extend along a word line direction to divide the alternating conductor/dielectric stack into a plurality of memory fingers.

The method further includes forming two parallel barrier structures laterally to extend along the word line direction, such that the first region is separated by the two parallel barrier structure from the second region and sandwiched between two neighboring slit structures.

The method further includes forming the barrier structure laterally extending along a bit line direction that is different than the word line direction to laterally separate the first region from the second region.

The method further includes forming the barrier structure to laterally extend along the bit line direction that is perpendicular to the word line direction.

The method further includes forming the barrier structure such that a width in the bit line direction of the first region enclosed by the barrier structure is larger than a distance between two neighboring slit structures.

The method further includes forming a staircase structure in the alternating dielectric stack adjacent to the barrier structure.

The method further includes forming at least one conductive layer on the staircase structure adjacent to the barrier structure to interconnect top select gates that are above the alternating conductor/dielectric stack in the second region, and on both sides of first region enclosed by the barrier structure in the word line direction.

The method further includes forming at least two barrier structures to enclose at least two first regions extending parallel along the bit line direction.

The method further includes forming a plurality of barrier structures to enclose a plurality of first regions from the second region, the plurality of first regions are aligned in the bit line direction, such that each of the plurality of first regions is sandwiched between two neighboring slit structures in the bit line direction.

The method further includes forming the plurality of barrier structures such that the plurality of first regions enclosed by the plurality of barrier structures are aligned as at least two columns in the bit line direction.

The method further includes forming a gap in the at least one silt structure that is sandwiched by two neighboring barrier structures in the bit line direction to for interconnect word lines of neighboring memory fingers.

The method further includes forming the barrier structure to separate the first region in the staircase structure at the edge of the alternating stack. An opening of the barrier structure is at the edge of the alternating layer stack along a bit line direction that is different than the word line direction.

The method further includes forming the barrier structure, such that a width of the first region in the bit line direction is larger than a distance between two neighboring slit structures.

The method further includes forming the barrier structure, such that a width of the first region in the bit line direction is less than a maximum distance between two neighboring slit structures in the staircase structure.

The method further includes forming a plurality of dummy channel structures adjacent to the barrier structure, each dummy channel structure extending vertically through the alternating conductor/dielectric stack.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
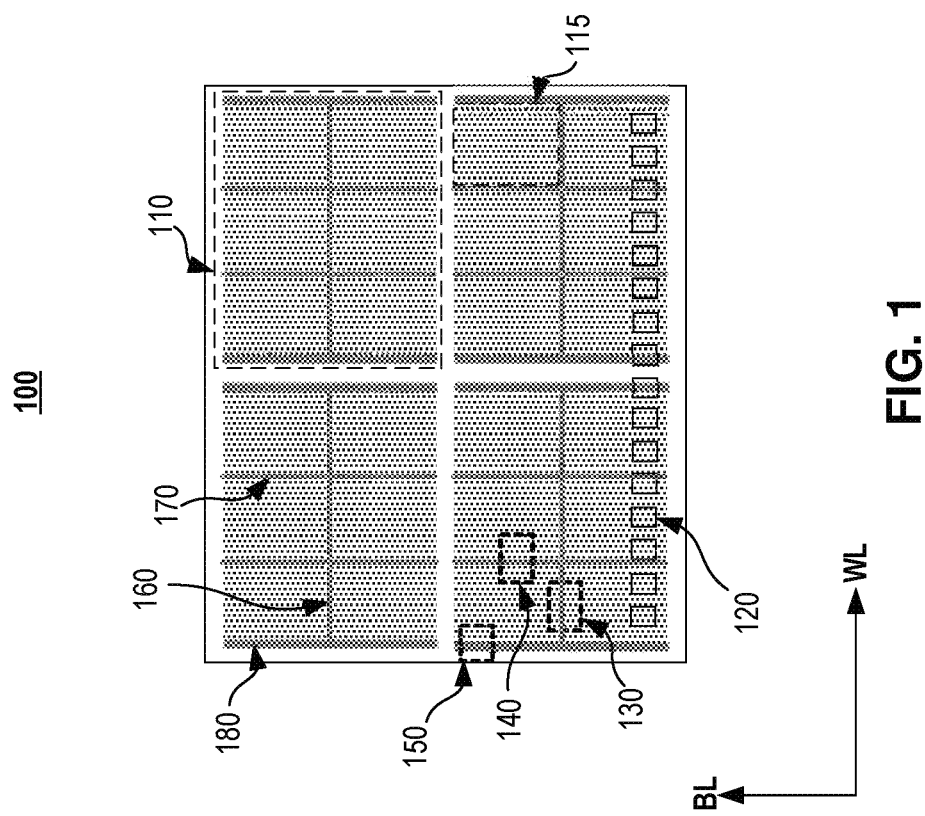
FIG. 1 illustrates a schematic diagram of an exemplary 3D memory device in a plan view, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a 3D memory device with through array contact (TAC) structures for a memory array (also referred to herein as an "array device"). The TAC structures allow contacts between the memory and various peripheral circuits and/or peripheral devices (e.g., page buffers, latches, decoders, etc.) to be fabricated in a limited number of steps (e.g., in a single step or in two steps), thereby reducing the process complexity and manufacturing cost. The disclosed TACs are formed through a stack of alternating dielectric layers, which can be more easily etched to form through holes therein compared with a stack of alternating conductor and dielectric layers.

The TACs can provide vertical interconnects between the stacked array device and peripheral device (e.g., for power bus and metal routing), thereby reducing metal levels and shrinking die size. In some embodiments, the TACs can be interconnected with various lines in a top conductive layer and/or a bottom conductive layer, which are suitable for those 3D memory architectures in which the array device and the peripheral device formed on different substrates are formed sequentially or joined by hybrid bonding in a face-to-face manner. In some embodiments, the TACs in the through array contact structures disclosed herein are formed through a stack of alternating dielectric layers, which can be more easily etched to form through holes therein compared with a stack of alternating conductor and dielectric layers, thereby reducing the process complexity and manufacturing cost.

FIG. 1 illustrates a schematic diagram of an exemplary 3D memory device 100 in the plan view, according to some embodiments of the present disclosure. 3D memory device 100 can include a plurality of channel structure regions (e.g., memory planes, memory blocks, memory fingers, etc., which are described in detail in connection with various figures below), while one or more TAC structures can be formed between two neighboring channel structure regions (e.g., two channel structure regions next to each other).

As shown in FIG. 1, 3D memory device 100 can include four or more memory planes 110, each of which can include a plurality of memory blocks 115. It is noted that, the arrangement of memory planes 110 in 3D memory device 100 and the arrangement of memory blocks 115 in each memory plane 100 illustrated in FIG. 1 are only used as an example, which is not limit the scope of the present disclosure.

TAC structures can include one or more bit line (BL) TAC regions 160 that are sandwiched by two neighboring memory blocks 115 in the bit line direction of the 3D memory device (labeled as "BL" in figures) and extended along the word line direction of the 3D memory device (labeled as "WL" in figures), one or more word line (BL) TAC regions 160 that are sandwiched by two neighboring memory blocks 115 in the word line direction (WL) and extended along the bit line direction (BL), and one or more staircase structure (SS) TAC regions 180 that are located at the edges of each memory plane 110.

In some embodiments, 3D memory device 100 can include a plurality of contact pads 120 arranged in a line at an edge of the 3D memory device 100. Interconnect contact can be used for electrically interconnect 3D memory device 100 to any suitable device and/or interface that provide driving power, receive control signal, transmit response signal, etc.

Figure 2:
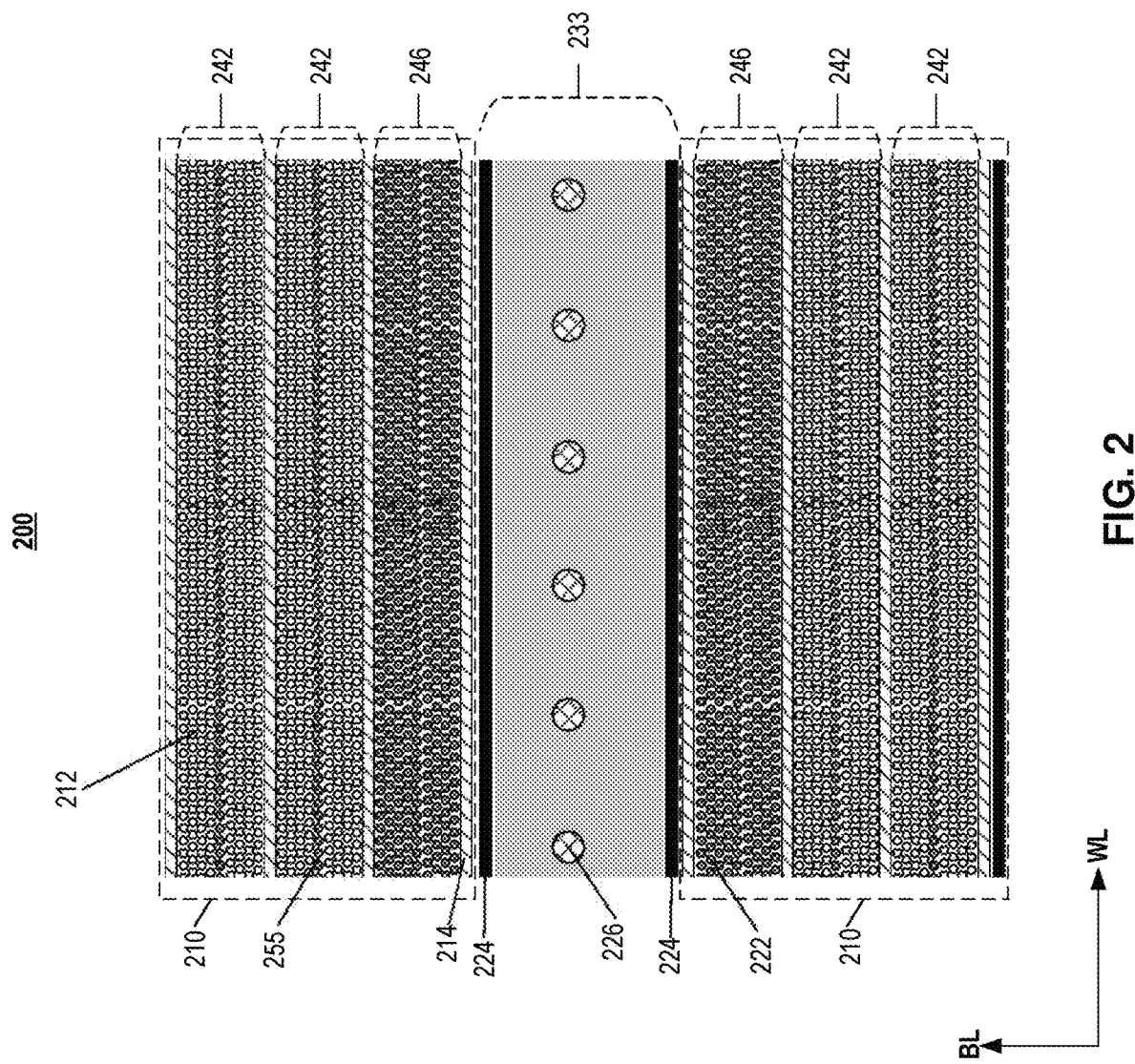
FIG. 2 illustrates a schematic enlarged plan view of a region of 3D memory device including an exemplary bit line through array contact region, according to some embodiments of the present disclosure.

FIG. 2 depicts an enlarged plan view of a region 130 shown in FIG. 1 including an exemplary bit line (BL) TAC region 160 of the 3D memory device. FIGS. 3A-3D depict enlarged plan views of a region 140 shown in FIG. 1 including various exemplary word line (WL) TAC regions 170 of the 3D memory device. FIGS. 4A and 4B depict enlarged plan views of the region 150 shown in FIG. 1 including various exemplary staircase structure (SS) TAC regions 180 of the 3D memory device.

Referring to FIG. 2, an enlarged plan view of the region 130 shown in FIG. 1 including an exemplary bit line (BL) TAC region of the 3D memory device is illustrated according to some embodiments of the present disclosure. The region 200 of the 3D memory device (i.e., region 130 as shown in FIG. 1) can include two channel structure regions 210 (e.g., neighboring memory blocks 115 in BL direction) and a bit line (BL) TAC region 233 (e.g., BL TAC region 160 as shown in FIG. 1).

Channel structure regions 210 can include an array of channel structures 212, each is part of a NAND string including a plurality of stacked memory cells. Channel structures 212 extend through a plurality of conductive layer and dielectric layer pairs that are arranged along a direction that is perpendicular to the plan view, which is also referred as a direction that is perpendicular to the surface of the substrate of the 3D memory device, and/or a "vertical direction" (which is illustrated in a cross-sectional view in connection with FIG. 5 described in detail below).

The plurality of conductor/dielectric layer pairs are also referred to herein as an "alternating conductor/dielectric stack." The number of the conductor/dielectric layer pairs in alternating conductor/dielectric stack (e.g., 32, 64, or 96) can set the number of memory cells in 3D memory device 100. Conductive layers and dielectric layers in alternating conductor/dielectric stack alternate in the vertical direction. In other words, except the ones at the top or bottom of alternating conductor/dielectric stack, each conductive layer can be adjoined by two dielectric layers on both sides, and each dielectric layer can be adjoined by two conductive layers on both sides.

Conductive layers can include conductive materials including, but not limited to, tungsten (W), cobalt (Co), copper (Cu), aluminum (Al), polycrystalline silicon (polysilicon), doped silicon, silicides, or any combination thereof. Dielectric layers can include dielectric materials including, but not limited to, silicon oxide, silicon nitride, silicon oxynitride, or any combination thereof. In some embodiments, conductive layers include metal layers, such as W, and dielectric layers include silicon oxide.

In some embodiments, BL TAC region 233 can be sandwiched by two neighboring channel structure regions 210 in BL direction, and can extend in WL direction. TAC region 233 can be defined by a barrier structure 224 in conjunction with the edges of BL TAC region 233 of the 3D memory device. Multiple TACs 226 can be formed in BL TAC region 233, which is enclosed laterally by barrier structure 224 and the edges of BL TAC region 233. In some embodiments, multiple TACs 226 in BL TAC region 233 can penetrate an alternating dielectric stack for switch routing and for reducing bit line capacitance.

The alternating dielectric stack can include a plurality of dielectric layer pairs that are arranged along the vertical direction that is perpendicular to the surface of the substrate of the 3D memory device (which is illustrated in a cross-sectional view in connection with FIG. 5 described in detail below). Each dielectric layer pair includes a first dielectric layer and a second dielectric layer that is different from first dielectric layer. In some embodiments, first dielectric layer and second dielectric layer each includes silicon nitride and silicon oxide. First dielectric layers in alternating dielectric stack can be the same as dielectric layers in the alternating conductor/dielectric stack described above. In some embodiments, the number of dielectric layer pairs in the alternating dielectric stack is the same as the number of the conductor/dielectric layer pairs in the alternating conductor/dielectric stack.

As shown in FIG. 2, each channel structure region 210 can include one or more slit structures 214 each extending in WL direction. At least some slit structures 214 can function as the common source contact for an array of channel structures 212 in channel structure regions 210. Slit structures 214 can also divide the 3D memory device into multiple memory fingers 242 and/or dummy memory fingers 246. A top select gate cut 255 can be disposed in the middle of each memory finger 242 to divide the top select gate (TSG) of the memory finger into two portions. The top select gate cut 255 can include dielectric materials including, but not limited to, silicon oxide, silicon nitride, silicon oxynitride, or any combination thereof.

In some embodiments, dummy channel structures 222 are formed in part of channel structure regions 210, for example, in dummy memory fingers 246 that are adjacent to BL TAC region 233 in BL direction. Dummy channel structures 222 can provide mechanical support for the memory array structures. Dummy memory fingers 246 do not have memory functions, and thus bit lines and related interconnect lines are not formed in dummy memory fingers 246.

Figure 3A:
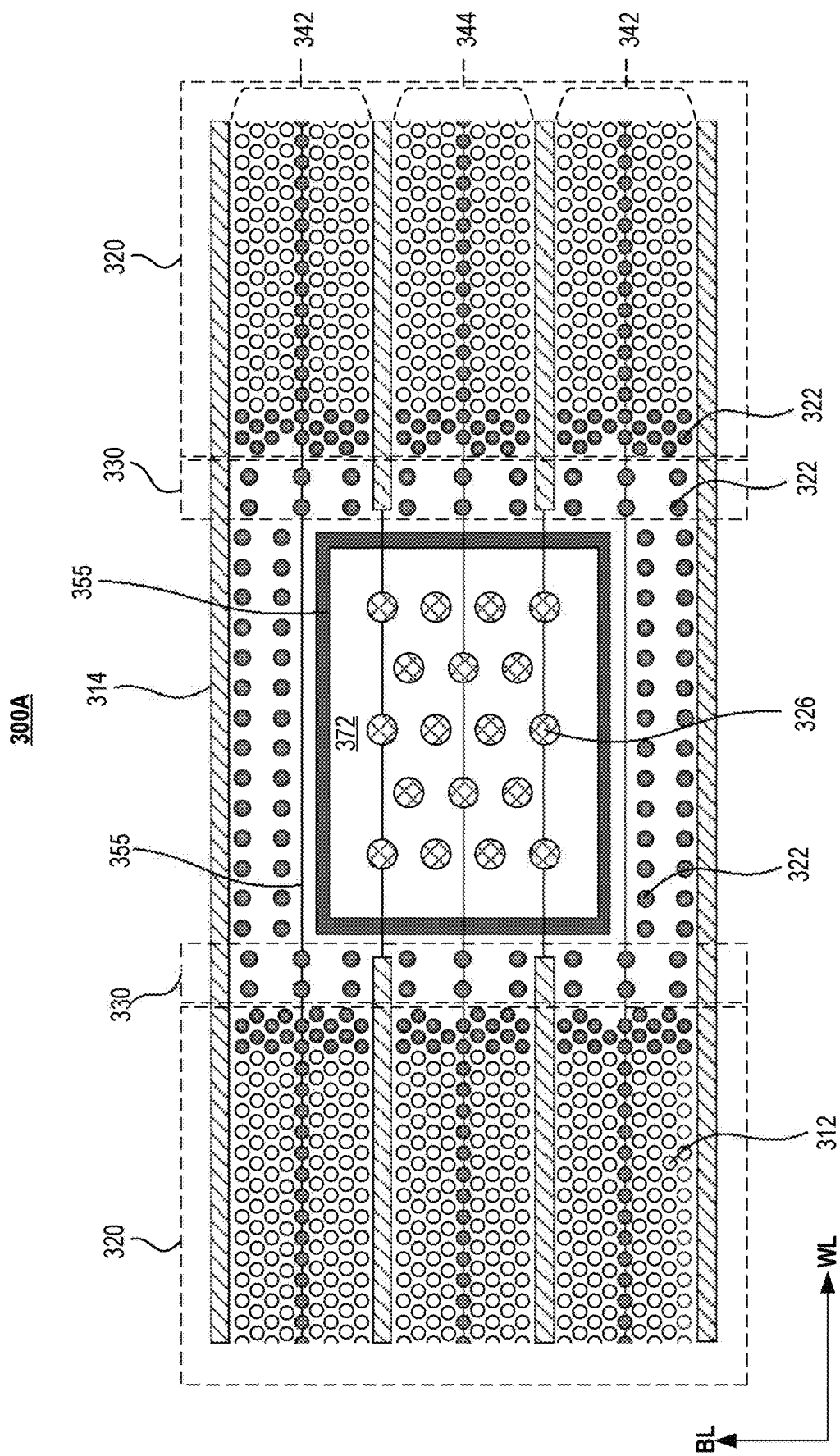
FIGS. 3A-3D illustrate schematic enlarged plan views of a region of 3D memory device including various exemplary word line through array contact regions, according to some embodiments of the present disclosure.
Figure 4A:
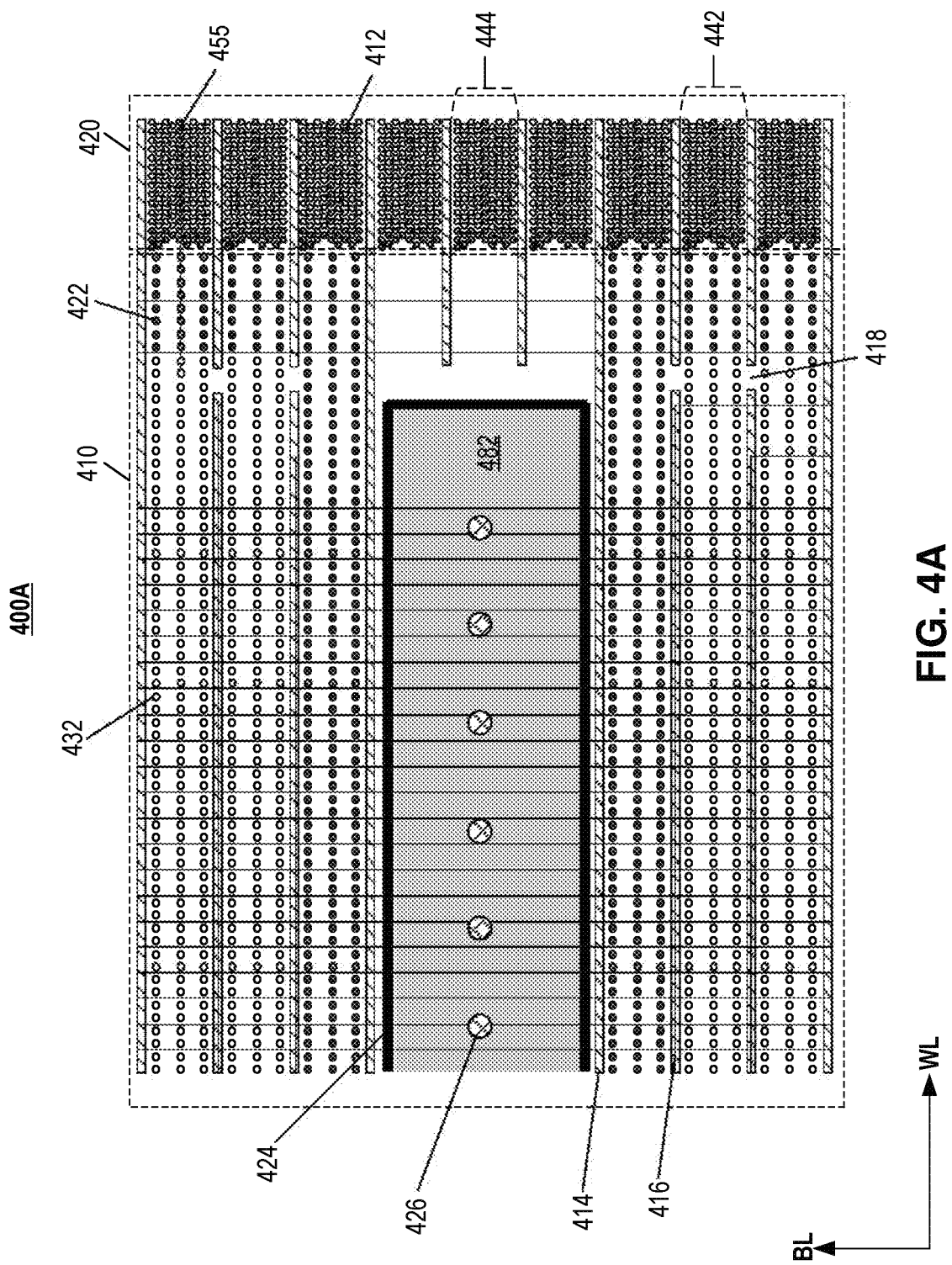
FIGS. 4A-4B illustrate schematic enlarged plan views of a region of 3D memory device including various exemplary staircase structure through array contact regions, according to some embodiments of the present disclosure.
Figure 4B:
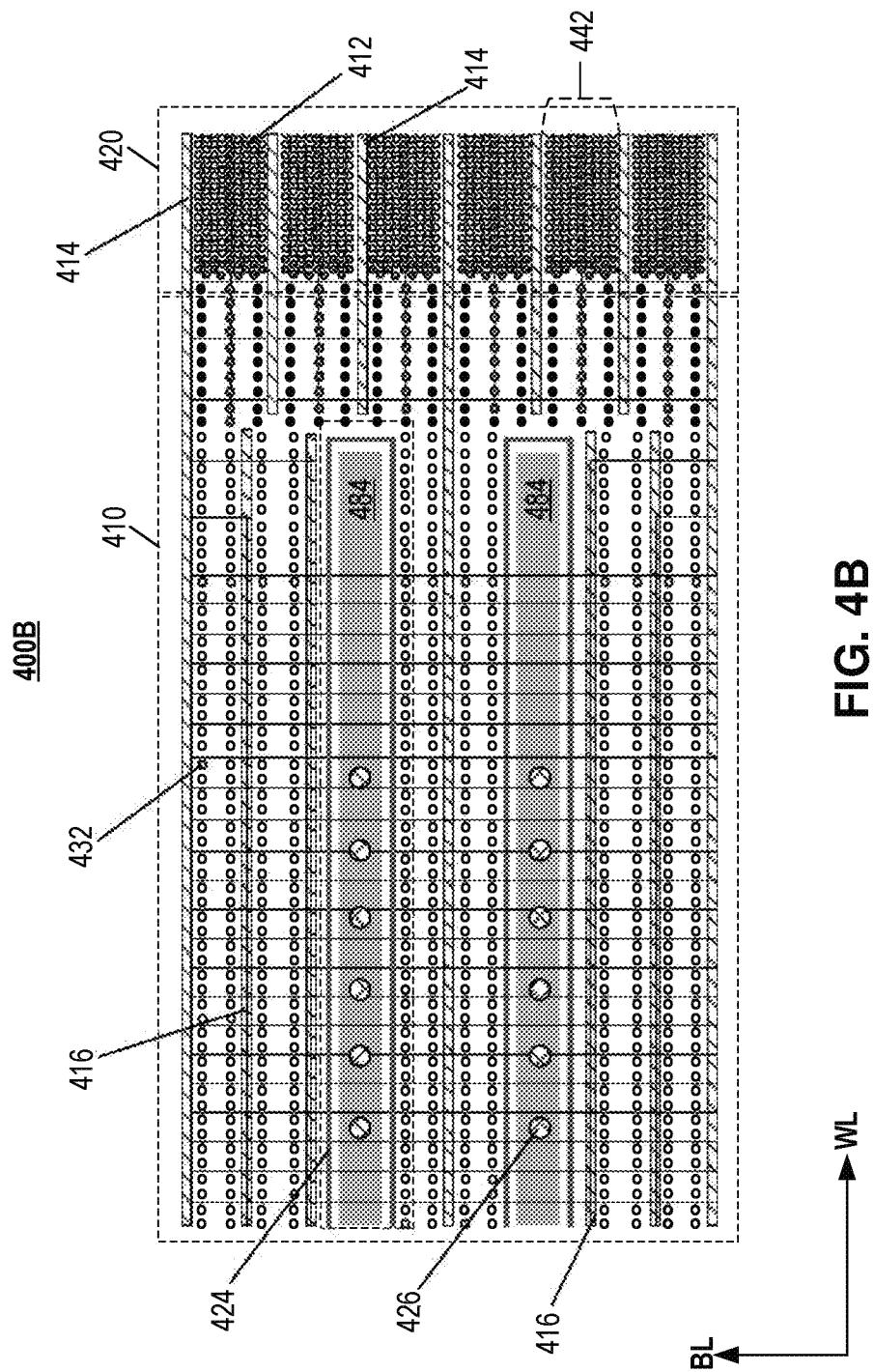

Referring to FIG. 3A, an enlarged plan view of the region 140 shown in FIG. 1 including an exemplary word line (WL) TAC region of the 3D memory device is illustrated according to some embodiments of the present disclosure. The region 300A of the 3D memory device (i.e., region 140 as shown in FIG. 1) can include channel structure regions 320, a word line (WL) TAC region 372 (e.g., WL TAC region 170 as shown in FIG. 1), and top selective gate (TSG) staircase regions 330.

As shown in FIG. 3A, channel structure regions 320 can include an array of channel structures 312, each including a plurality of stacked memory cells. TSG staircase regions 330 can be disposed on the sides of channel structure regions 320 and adjacent to WL TAC region 372 in the plan view. That is, WL TAC region 372 is sandwiched by two TSG staircase regions 330 in WL direction. WL TAC region 372 can be defined by a barrier structure 324. Multiple TACs 326 used for switch routing and for reducing word line capacitance can be formed in WL TAC region 372, which is enclosed laterally by barrier structure 324.

In some embodiments, dummy channel structures 322 are formed outside WL TAC region 372 to provide mechanical support for the memory array structures. It is understood that dummy channel structures 322 can be formed in any regions outside WL TAC region 372, for example, in TSG staircase regions 330, and along the edges of channel structure regions 320 adjacent to TSG staircase regions 330. It is noted that, channel structures 312 and dummy channel structures 322 penetrate the alternating conductor/dielectric stack, while TACs 326 penetrate the alternating dielectric stack.

In some embodiments, a plurality of slit structures 314 each extending in WL direction can divide the 3D memory device into multiple memory fingers 342, 344. At least some slit structures 314 can function as the common source contact for an array of channel structures 312 in channel structure regions 320. Sidewalls of slit structures 314 can include dielectric materials including, but not limited to, silicon oxide, silicon nitride, silicon oxynitride, or any combination thereof. Filling material of slit structures 314 can include conductive materials including, but not limited to, tungsten (W), cobalt (Co), copper (Cu), aluminum (Al), polycrystalline silicon (polysilicon), doped silicon, silicides, or any combination thereof.

A top select gate cut 355 can be disposed in the middle of each memory finger 342, 344 to divide the top select gate (TSG) of the memory finger into two portions. The top select gate cut 355 can include dielectric materials including, but not limited to, silicon oxide, silicon nitride, silicon oxynitride, or any combination thereof.

It is noted that, a width of WL TAC region 372 in BL direction can be larger than a width of each memory finger 342 or 344. That is, barrier structure 324 in BL direction can cross at least two neighboring slit structures 314. As such, the conductive layers in channel structure regions 320 in memory finger 344 can be completely blocked by barrier structure 324. Therefore, the top selective gates of channel structures 312 between two channel structure regions 320 in memory finger 344 on both side of WL TAC region 372 are not interconnected by the top conductive layers in the alternating conductor/dielectric stack.

To interconnect the top selective gates of channel structures 312 between two channel structure regions 320 in memory finger 344 on both side of WL TAC region 372, TSG staircase regions 330 can include one or more conductive lines (not shown in FIG. 3A) formed on a staircase structure (e.g., within top two to four levels) for making electrical interconnections with the top selective gates of channel structures 312 between two channel structure regions 320 in memory finger 344 that are separated by WL TAC region 372.

For example, slit structures 314 that are cut off by WL TAC region 372 can extend into TSG staircase regions 330. The top two conductive layers in the alternating conductor/dielectric stack can have a single-side staircase structure. One or more interconnection layers with contacts can be formed on the single-side staircase structure to provide electrical interconnection between the top selective gates of channel structures 312 in channel structure regions 320 and in memory finger 344 that are separated by WL TAC region 372.

Accordingly, by introducing TSG staircase regions 330 that interconnect the top selective gates on both sides of WL TAC region 372, WL TAC region 372 can extend along BL direction to provide an enough size to enclose a desired number of TACS 326. Further, each memory plane 110 as shown in FIG. 1 can include multiple WL TAC regions 372 arranged in WL direction. That is, multiple memory blocks 115 can be arranged in WL direction in each memory plane 110.

Figure 3B:
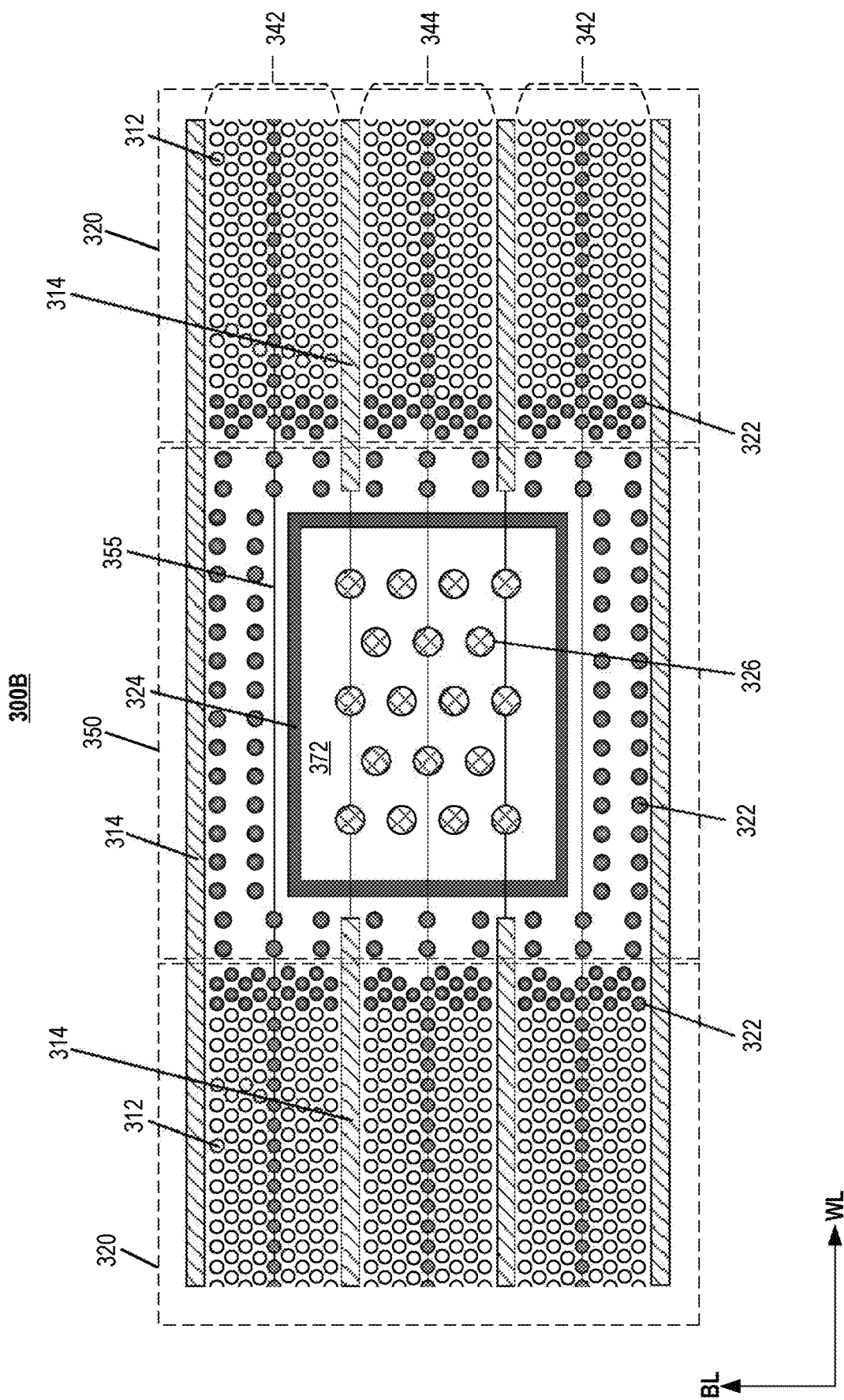

Referring to FIG. 3B, an enlarged plan view of the region 140 shown in FIG. 1 including another exemplary word line (WL) TAC region of the 3D memory device is illustrated according to some alternative embodiments of the present disclosure. The region 300B of the 3D memory device (i.e., region 140 as shown in FIG. 1) can include channel structure regions 320, a dummy channel region 350 that encloses a word line (WL) TAC region 372 (e.g., WL TAC region 170 as shown in FIG. 1).

As shown in FIG. 3B, channel structure regions 320 can include an array of channel structures 312, each including a plurality of stacked memory cells. Dummy channel region 350 is sandwiched by two channel structure regions 320 in WL direction. WL TAC region 372 is enclosed by dummy channel region 350. WL TAC region 372 can be defined by a barrier structure 324. Multiple TACs 326 can be formed in WL TAC region 372, which is enclosed laterally by barrier structure 324.

In some embodiments, dummy channel structures 322 are formed outside WL TAC region 372 to provide mechanical support for the memory array structures. It is understood that dummy channel structures 322 can be formed in any regions outside WL TAC region 372, for example, in dummy channel region 350, and along the edges of channel structure regions 320 adjacent to dummy channel region 350. It is noted that, channel structures 312 and dummy channel structures 322 penetrate the alternating conductor/dielectric stack, while TACs 326 penetrate the alternating dielectric stack.

In some embodiments, a plurality of slit structures 314 each extending in WL direction can divide the 3D memory device into multiple memory fingers 342, 344. A top select gate cut 355 can be disposed in the middle of each memory finger 342, 344 to divide the top select gate (TSG) of the memory finger into two portions.

It is noted that, a width of WL TAC region 372 in BL direction can be larger than a width of each memory finger 342 or 344. That is, barrier structure 324 in BL direction can cross at least two neighboring slit structures 314. As such, the conductive layers in channel structure regions 320 in memory finger 344 can be completely blocked by barrier structure 324. Therefore, the top selective gates of channel structures 312 between two channel structure regions 320 in memory finger 344 on both side of WL TAC region 372 are not interconnected by the top conductive layers in the alternating conductor/dielectric stack.

Because of that, in some embodiments associated with such design of WL TAC region 372, one memory plane 110 can include only two memory blocks 115 in WL direction. WL TAC region 372 is sandwiched by the two memory blocks (i.e., channel structure regions 320 as shown in FIG. 3B), while the outer sides of channel structure regions 320 in WL direction can have a staircase structure (not shown in FIG. 3B). Thus, the top selective gates of channel structures 312 between two channel structure regions 320 in memory finger 344 on both side of WL TAC region 372 can be interconnected by using the staircase structure on the edges of the memory plane 110 of the 3D NAND device. Such deign can be suitable for zigzag word line decoder (X-DEC) routing.

Figure 3C:
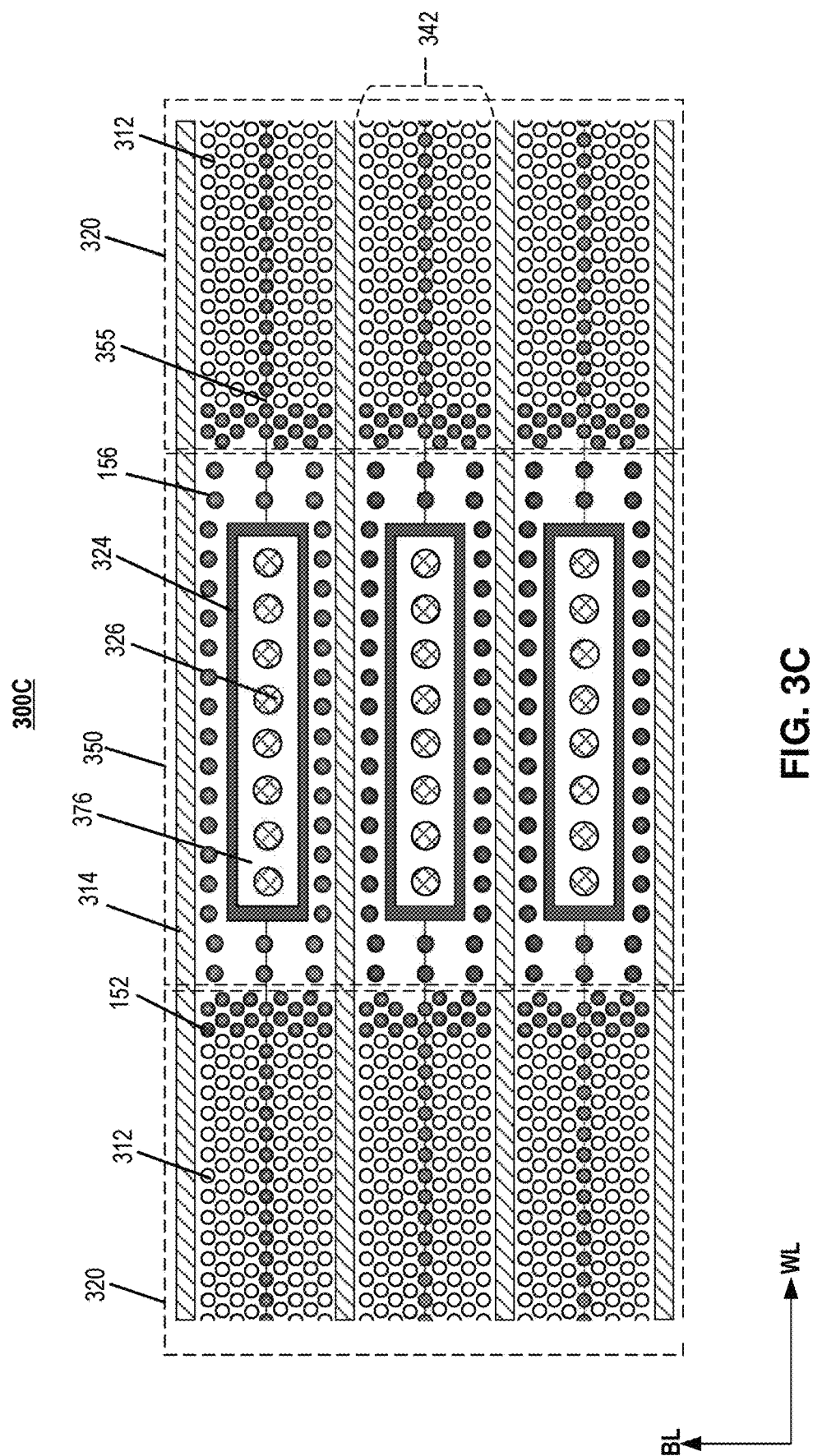

Referring to FIG. 3C, an enlarged plan view of the region 140 shown in FIG. 1 including other exemplary word line (WL) TAC regions of the 3D memory device is illustrated according to some alternative embodiments of the present disclosure. The region 300C of the 3D memory device (i.e., region 140 as shown in FIG. 1) can include channel structure regions 320, a dummy channel region 350 that encloses a plurality of word line (WL) TAC regions 376.

As shown in FIG. 3C, in some embodiments, a plurality of slit structures 314 each extending in WL direction can divide the 3D memory device into multiple memory fingers 342. A top select gate cut 355 can be disposed in the middle of each memory finger 342 to divide the top select gate (TSG) of the memory finger into two portions.

Channel structure regions 320 can include an array of channel structures 312, each including a plurality of stacked memory cells. Dummy channel region 350 is sandwiched by two channel structure regions 320 in WL direction. A plurality of WL TAC regions 376 arranged in a column along BL direction are enclosed by dummy channel region 350. Each WL TAC region 376 can be defined by a barrier structure 324. Multiple TACs 326 can be formed in each WL TAC region 376, which is enclosed laterally by barrier structure 324.

In some embodiment, a width of each WL TAC region 376 in BL direction can be less than a width of each memory finger 342. That is, barrier structure 324 of each WL TAC region 376 can be located between two neighboring slit structures 314. Since barrier structure 324 of each WL TAC region 376 does not complete block the conductive layers in dummy channel region 350, the top selective gates of channel structures 312 between two channel structure regions 320 in each memory finger 342 on both side of WL TAC region 376 can be interconnected by the top conductive layers in the alternating conductor/dielectric stack in dummy channel region 350.

In some embodiments, dummy channel structures 322 are formed outside WL TAC region 376 to provide mechanical support for the memory array structures. It is understood that dummy channel structures 322 can be formed in any regions outside WL TAC region 376, for example, in dummy channel region 350, and along the edges of channel structure regions 320 adjacent to dummy channel region 350. It is noted that, channel structures 312 and dummy channel structures 322 penetrate the alternating conductor/dielectric stack, while TACs 326 penetrate the alternating dielectric stack.

Accordingly, by disposing one WL TAC region 376 within each memory finger 342, the top conductive layers in the alternating conductor/dielectric stack may not be blocked by the WL TAC region 376. Thus, no additional structure is requested to further interconnect the top selective gates of channel structures 312 between two channel structure regions 320 in each memory finger 342 on both side of WL TAC region 376. Therefore, multiple WL TAC regions 376 can be arranged in each memory finger 342 along WL direction. That is, a memory 110 can include multiple memory blocks 115 in WL direction.

Figure 3D:
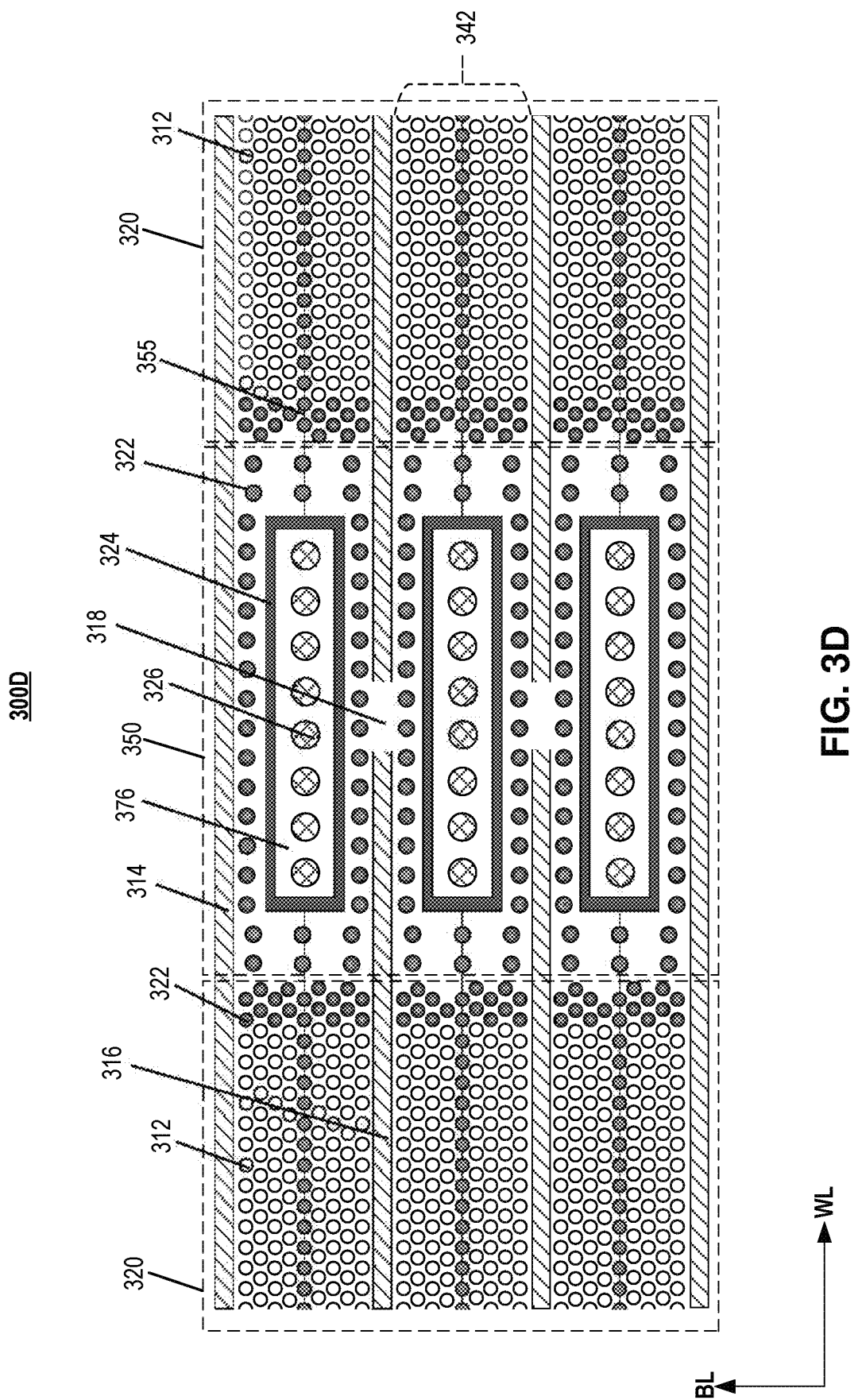

Referring to FIG. 3D, an enlarged plan view of the region 140 shown in FIG. 1 including other exemplary word line (WL) TAC regions of the 3D memory device is illustrated according to some alternative embodiments of the present disclosure. The region 300D of the 3D memory device (i.e., region 140 as shown in FIG. 1) can include channel structure regions 320, a dummy channel region 350 that encloses a plurality of word line (WL) TAC regions 376.

As shown in FIG. 3D, in some embodiments, a plurality of slit structures 314, 316 each extending in WL direction can divide the 3D memory device into multiple memory fingers 342. In some embodiments, slit structures 314 can extend in WL direction all the way in through two or more channel structure regions 320 and one or more dummy channel regions 350. At least one silt structure 316 can include a gap 318 in a dummy channel region 350, as shown in FIG. 3D. A top select gate cut 355 can be disposed in the middle of each memory finger 342 to divide the top select gate (TSG) of the memory finger into two portions.

Channel structure regions 320 can include an array of channel structures 312, each including a plurality of stacked memory cells. Dummy channel region 350 is sandwiched by two channel structure regions 320 in WL direction. A plurality of WL TAC regions 376 arranged in a column along BL direction are enclosed by dummy channel region 350. Each WL TAC region 376 can be defined by a barrier structure 324. Multiple TACs 326 can be formed in each WL TAC region 376, which is enclosed laterally by barrier structure 324.

In some embodiment, a width of each WL TAC region 376 in BL direction can be less than a width of each memory finger 342. That is, barrier structure 324 of each WL TAC region 376 can be located between two neighboring slit structures 314. Since barrier structure 324 of each WL TAC region 376 does not complete block the conductive layers in dummy channel region 350, the top selective gates of channel structures 312 between two channel structure regions 320 in each memory finger 342 on both side of WL TAC region 376 can be interconnected by the top conductive layers in the alternating conductor/dielectric stack in dummy channel region 350.

In some embodiments, dummy channel structures 322 are formed outside WL TAC region 376 to provide mechanical support for the memory array structures. It is understood that dummy channel structures 322 can be formed in any regions outside WL TAC region 376, for example, in dummy channel region 350, and along the edges of channel structure regions 320 adjacent to Dummy channel region 350. It is noted that, channel structures 312 and dummy channel structures 322 penetrate the alternating conductor/dielectric stack, while TACs 326 penetrate the alternating dielectric stack.

In some embodiments, one or more silt structure 316 can include a gap 318 in a dummy channel region 350. The word lines in neighboring memory fingers 342 can be interconnected by using conductive lines going through the gap 318. For example, as shown in FIG. 3D, the slit structures 314 that are at the edges of a memory block 115 can extend in WL direction all the way in through two or more channel structure regions 320 and one or more dummy channel regions 350, while silt structures 316 inside of each memory block 115 can include one or more gaps 318 in corresponding dummy channel regions 350 respectively. As such, all the top select gates and/or word lines in the same memory block 115 can be interconnected without additional structures.

Accordingly, by disposing WL TAC region 376 within memory finger 342 and providing gap 318 in silt structure 316, the top conductive layers in the alternating conductor/dielectric stack may not be blocked by the WL TAC region 376, and word lines in neighboring memory fingers 342 can be interconnected. Therefore, multiple WL TAC regions 376 can be arranged in each memory finger 342 along WL direction. That is, a memory 110 can include multiple memory blocks 115 in WL direction. Such structure can have a high integration level and a simply layout that can be easily fabricated.

Referring to FIG. 4A, an enlarged plan view of the region 150 shown in FIG. 1 including an exemplary staircase structure (SS) TAC region of the 3D memory device is illustrated according to some embodiments of the present disclosure. The region 400A of the 3D memory device (i.e., region 150 as shown in FIG. 1) can include channel structure regions 420, a staircase region 410, and a staircase structure (SS) TAC regions 482.

Channel structure region 420 can include an array of channel structures 412, each including a plurality of stacked memory cells. Staircase region 410 can include a staircase structure and an array of word line contacts 432 formed on the staircase structure. In some embodiments, SS TAC region 482 is in staircase region 410. SS TAC region 482 can be defined by a barrier structure 424 alone or in conjunction with an edge of staircase region 410 of the 3D memory device. Multiple TACs 426 can be formed in SS TAC region 482, which is enclosed laterally by at least barrier structure 424.

As shown in FIG. 4A, in some embodiments, a plurality of slit structures 414, 416 each extending in WL direction can divide the 3D memory device into multiple memory fingers 442, 444. In some embodiments, slit structures 414 can extend in WL direction into at least a portion of staircase region 410. At least some silt structures 416 can include one or more gaps 418 in staircase region 410. A top select gate cut 455 can be disposed in the middle of each memory finger 442, 444 to divide the top select gate (TSG) of the memory finger into two portions.

In some embodiments, one or more silt structure 416 can include a gap 418 in staircase region 410. Word line contacts 432 in neighboring memory fingers 442 can be interconnected by using conductive lines going through the gap 418. For example, as shown in FIG. 4A, the slit structures 414 that are at the edges of a memory block 115 can extend in WL direction all the way in through channel structure region 420 and staircase region 410, while silt structures 416 inside of each memory block 115 can include one or more gaps 418 in staircase region 410. As such, all word line contacts 432 in the same memory block 115 can be interconnected without additional structures.

It is noted that, a width of SS TAC region 482 in BL direction can be larger than a width of each memory finger 442, 444. That is, barrier structure 424 in BL direction can cross at least two neighboring slit structures 414. Since SS TAC region 482 occupies the area of a portion of staircase region 410 that corresponds to memory fingers 444 completely blocked by barrier structure 424, the staircase structure in SS TAC region 482 is used for forming TACs 426 rather than forming word line contacts 432 for memory fingers 444. Therefore, the staircase structure corresponding to memory fingers 444 on the other side of memory plane 110 (not shown in FIG. 4B) can be used to form word line contacts 432 rather than SS TAC region 482.

Accordingly, in some embodiments associated with such design of SS TAC region 482, SS TAC regions 482 on both sides of memory plane 110 do not overlap in WL direction. That is, one memory finger corresponds to at maximum one SS TAC region 482. Such deign can be suitable for zigzag word line decoder (X-DEC) routing. Further, in some embodiments associated with designs of SS TAC region 482 as well as WL TAC region 372 described above in connection with FIG. 3B, due to the same reason, SS TAC regions 482 and WL TAC regions 372 do not overlap in WL direction. That is, one memory finger corresponds to either one SS TAC region 482 or one WL TAC regions 372 at maximum.

Referring to FIG. 4B, an enlarged plan view of the region 150 shown in FIG. 1 including other exemplary staircase structure (SS) TAC regions of the 3D memory device is illustrated according to some alternative embodiments of the present disclosure. The region 400B of the 3D memory device (i.e., region 150 as shown in FIG. 1) can include channel structure regions 420, a staircase region 410, and a plurality of staircase structure (SS) TAC regions 484.

Channel structure region 420 can include an array of channel structures 412, each including a plurality of stacked memory cells. Staircase region 410 can include a staircase structure and an array of word line contacts 432 formed on the staircase structure. In some embodiments, SS TAC regions 484 are in staircase region 410. Each SS TAC regions 484 can be defined by a barrier structure 424 alone or in conjunction with an edge of staircase region 410 of the 3D memory device. Multiple TACs 426 can be formed in SS TAC region 482, which is enclosed laterally by at least barrier structure 424.

As shown in FIG. 4B, in some embodiments, a plurality of slit structures 414 each extending in WL direction in channel structure regions 420 can divide the 3D memory device into multiple memory fingers 442. A top select gate cut 455 can be disposed in the middle of each memory finger 442 to divide the top select gate (TSG) of the memory finger into two portions. In some embodiments, slit structures 414 can extend in WL direction into at least a portion of staircase region 410. In some embodiments, staircase region 410 can further include multiple slit structures 416 that are not aligned with slit structures 414 in WL direction. That is, distances between neighboring slit structures in staircase region 410 can be non-uniform. Some neighboring slit structure pairs can have a first distance that is larger than a second distance between other neighboring slit structure pairs.

In some embodiments, each SS TAC region 484 can be located between the neighboring slit structure pair that have the first distance. That is, a width of SS TAC region 484 in BL direction can be less than the first distance. As such, other than the space occupied by SS TAC region 484, staircase region 410 between such neighboring slit structure pair that have the first distance can have extra space to form word line contacts 432.

Figure 5A:
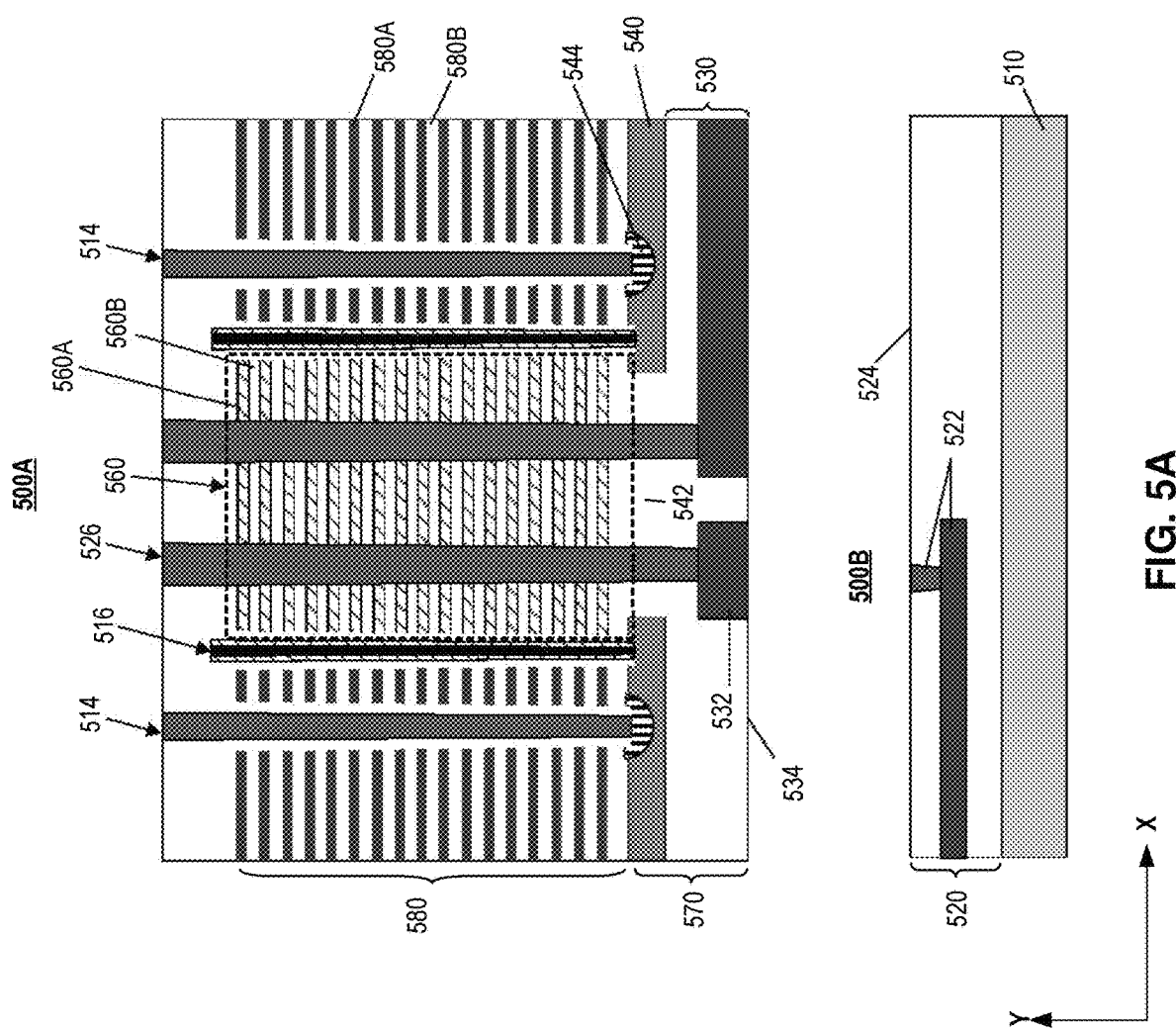
FIGS. 5A-5B illustrate schematic cross-sectional views of an exemplary 3D memory device at certain fabricating stages according to some embodiments of the present disclosure.
Figure 5B:
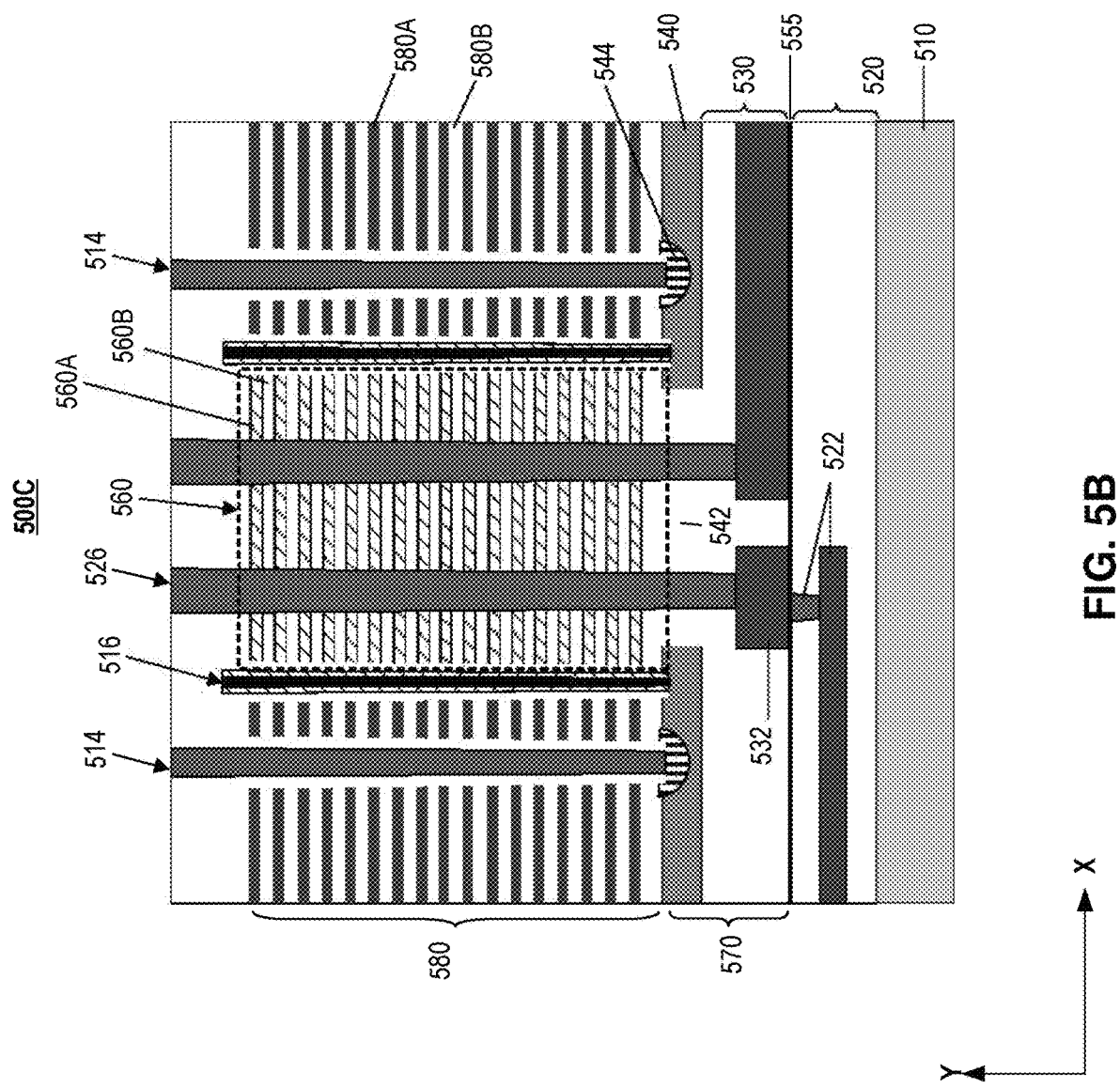

Referring to FIGS. 5A-5B, schematic cross-sectional views of an exemplary 3D memory device at certain fabricating stages are shown according to some embodiments of the present disclosure. FIG. 5A illustrates two separate chips 500A and 500B before bonding, while FIG. 5B illustrates 3D memory device 500C that is formed by bonding first chip 500A and second chip 500B. It is noted that, 3D memory device 500C shown in FIG. 5B can be part of a non-monolithic 3D memory device, in which components (e.g., the peripheral device and array device) can be formed separately on different substrates. For example, 3D memory device 500C can be region 130, region 140, or region 150 described above in connection with FIG. 1.

As shown in FIG. 5A, first chip 500A can include a first substrate 570 and an array device above first substrate 570. It is noted that X and Y axes are added in FIGS. 5A and 5B to further illustrate the spatial relationship of the components in chips 500A and 500B, as well as 3D memory device 500C. First substrate 570 includes a first bonding interface 534, which can be a lateral bottom surface extending laterally in the X direction (the lateral direction, e.g., WL direction or BL direction).

As used herein, whether one component (e.g., a layer or a device) is "on," "above," or "below" another component (e.g., a layer or a device) of a semiconductor device (e.g., array device) is determined relative to the substrate of the semiconductor device (e.g., first substrate 570) in the Y direction (the vertical direction) when the substrate is positioned (or otherwise disposed) in the lowest plane of the semiconductor device in the Y direction. The cross-sectional view of the 3D memory device shown in FIGS. 5A and 5B is along a plane in BL direction and Y direction. The same notion for describing spatial relationship is applied throughout the present disclosure.

First substrate 570 can be used for supporting the array device, and can include an array interconnection layer 530 and a base substrate 540. Array interconnection layer 530 can be a back-end-of-line (BEOL) interconnection layer including one or more interconnection structures 532 embedded in a dielectric layer. Interconnection structures 532 can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof. The dielectric layer can include dielectric materials including, but not limited to, silicon oxide, silicon nitride, silicon oxynitride, or any combination thereof. One or more portions of interconnection structures 532 can be exposed on the first bonding surface 534 of first substrate 570.

Base substrate 540 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, base substrate 540 is a thinned substrate (e.g., a semiconductive layer), which was thinned by grinding, wet/dry etching, chemical mechanical polishing (CMP), or any combination thereof. In some embodiments, base substrate 540 can be a single layer substrate or a multi-layer substrate, for example, a monocrystalline single-layer substrate, a polycrystalline silicon (polysilicon) single-layer substrate, a polysilicon and metal multi-layer substrate, etc.

Further, one or more openings 542 can be formed in regions of base substrate 540 that correspond to one or more through array contact (TAC) structures of the array device. In some embodiments, a plurality of TACs 526 can go through one or more openings 542 to electrically connect with one or more interconnection structures 532 in array interconnection layer 530. In some other embodiments, a plurality of conductive plugs (not shown) penetrating through the one or more openings 542 can be used to electrically connect the plurality of TACs to one or more interconnection structures 532 in array interconnection layer 530. It is noted that, one or more openings 542 are filled with dielectric material to insulate the plurality of TACs 526 and/or plurality of conductive plugs.

In some embodiments, array device can be a NAND Flash memory device in which memory cells are provided in the form of an array of channel structures (not shown in FIGS. 5A and 5B) extending in Y direction above substrate 570. The array device can include a plurality of channel structures that extend through an alternating conductor/dielectric stack 580 including a plurality of conductive layer 580A and dielectric layer 580B pairs. The number of the conductor/dielectric layer pairs in alternating conductor/dielectric stack 580 (e.g., 32, 64, or 96) can set the number of memory cells in 3D memory device.

Conductive layers 580A and dielectric layers 580B in alternating conductor/dielectric stack 580 alternate in Y direction. In other words, except the ones at the top or bottom of alternating conductor/dielectric stack 580, each conductive layer 580A can be adjoined by two dielectric layers 580B on both sides, and each dielectric layer 580B can be adjoined by two conductive layers 580A on both sides. Conductive layers 580A can each have the same thickness or have different thicknesses. Similarly, dielectric layers 580B can each have the same thickness or have different thicknesses. Conductive layers 580A can include conductive materials including, but not limited to, tungsten (W), cobalt (Co), copper (Cu), aluminum (Al), polycrystalline silicon (polysilicon), doped silicon, silicides, or any combination thereof. Dielectric layers 580B can include dielectric materials including, but not limited to, silicon oxide, silicon nitride, silicon oxynitride, or any combination thereof. In some embodiments, conductive layers 580A include metal layers, such as W, and dielectric layers 580B include silicon oxide.

In some embodiments, the array device further includes slit structures 514. Each slit structure 514 can extend in the Y direction through alternating conductor/dielectric stack 580. Slit structure 514 can also extend laterally (i.e., substantially parallel to the substrate) to separate alternating conductor/dielectric stack 580 into multiple blocks. Slit structure 514 can include a slit filled with conductive materials including, but not limited to, W, Co, Cu, Al, silicides, or any combination thereof. Slit structure 514 can further include a dielectric layer with any suitable dielectric materials between the filled conductive materials and alternating conductor/dielectric stack 580 to electrically insulate the filled conductive materials from surrounding conductive layers 580A in alternating conductor/dielectric stack 580. As a result, slit structures 514 can separate 3D memory device 500 into multiple memory fingers (e.g., as shown in FIGS. 2, 3A-3D, 4A-4B in the plan view).

In some embodiments, slit structure 514 functions as the source contact for channel structures in the same memory finger that share the same array common source. Slit structure 514 can thus be referred to as a "common source contact" of multiple channel structures. In some embodiments, base substrate 540 includes a doped region 544 (including p-type or n-type dopants at a desired doping level), and the lower end of slit structure 514 is in contact with doped region 544 of base substrate 540.

In some embodiments, an alternating dielectric stack 560 can be located in a region that is surrounded laterally by a barrier structure 516 on base substrate 540. Alternating dielectric stack 560 can include a plurality of dielectric layer pairs. For example, alternating dielectric stack 560 is formed by an alternating stack of a first dielectric layer 560A and a second dielectric layer 560B that is different from first dielectric layer 560A. In some embodiments, first dielectric layer 560A includes silicon nitride and second dielectric layer 560B includes silicon oxide. Second dielectric layers 560B in alternating dielectric stack 560 can be the same as dielectric layers 580B in alternating conductor/dielectric stack 580. In some embodiments, the number of dielectric layer pairs in alternating dielectric stack 560 is the same as the number of conductor/dielectric layer pairs in alternating conductor/dielectric stack 580.

In some embodiments, barrier structure 516 extending in the Y direction to separate laterally alternating conductor/dielectric stack 580 and alternating dielectric stack 560. That is, barrier structure 516 can become the boundary between alternating conductor/dielectric stack 580 and alternating dielectric stack 560. Alternating dielectric stack 560 can be enclosed laterally by at least barrier structure 516. In some embodiments, barrier structure 516 is in a closed shape (e.g., a rectangle, a square, a circle, etc.) in the plan view to completely enclose alternating dielectric stack 560. For example, as shown in FIGS. 3A-3D, barrier structures 324 are in a rectangle shape in the plan view to completely enclose the alternating dielectric stack in WL TAC regions 372, 376. In some embodiments, barrier structure 516 is not in a closed shape in the plan view, but can enclose alternating dielectric stack 560 in conjunction with one or more edges of array device. For example, as shown in FIGS. 4A and 4B, barrier structure 424, in conjunction with the edge(s) of the 3D memory device, encloses the alternating dielectric stack in SS TAC regions 482, 484.

As shown in FIG. 5A, first chip 500A further includes a plurality of TACs 526 each extending in Y direction through alternating dielectric stack 560. TACs 526 can be formed only inside the area enclosed laterally by at least barrier structure 516, which includes a plurality of dielectric layer pairs. That is, TACs 526 can extend vertically through dielectric layers (e.g., first dielectric layers 560S and second dielectric layers 560B), but not through any conductive layers (e.g., conductive layers 580A). Each TAC 526 can extend through the entire thickness of alternating dielectric stack 560, (e.g., all the dielectric layer pairs in Y direction). In some embodiments, TAC 526 further penetrate base substrate 540 through opening 542 and electrically contact interconnection structure 532.

TACs 526 can carry electrical signals from and/or to the array device, such as part of the power bus, with shorten interconnect routing. In some embodiments, TACs 526 can provide electrical connections between the array device and the peripheral devices (not shown in FIGS. 5A and 5B) through one or more interconnection structures 532. TACs 526 can also provide mechanical support to alternating dielectric stack 560. Each TAC 526 can include a vertical opening through alternating dielectric stack 560 and that is filled with conductive materials, including, but not limited to, W, Co, Cu, Al, doped silicon, silicides, or any combination thereof. In some embodiments, as TACs 526 are formed in alternating dielectric stack 560 (surrounding by dielectric layers), an additional dielectric layer between TAC 526 and alternating dielectric stack 560 is not needed for insulation purposes.

Second chip 500B can include a second substrate 510 and a peripheral interconnection layer 520 on the second substrate 510. Second substrate 510 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. Second substrate 510 can be a single layer substrate or a multi-layer substrate, for example, a monocrystalline single-layer substrate, a polycrystalline silicon (polysilicon) single-layer substrate, a polysilicon and metal multi-layer substrate, etc. In some embodiments, second substrate 510 is a thinned substrate (e.g., a semiconductive layer), which was thinned by grinding, wet/dry etching, chemical mechanical polishing (CMP), or any combination thereof.

One or more peripheral circuits (not shown in FIGS. 5A and 5B) can be formed on the second substrate 510. The one or more peripheral circuits can include any suitable digital, analog, and/or mixed-signal peripheral circuits used for facilitating the operation of the 3D memory device. For example, the one or more peripheral circuits can include one or more of a page buffer, a decoder (e.g., a row decoder and a column decoder), a latch, a sense amplifier, a driver, a charge pump, a current or voltage reference, or any active or passive components of the circuits (e.g., transistors, diodes, resistors, or capacitors). In some embodiments, the one or more peripheral circuits can be formed on second substrate 510 using complementary metal-oxide-semiconductor (CMOS) technology (also known as a "CMOS chip").

In some embodiments, peripheral interconnection layer 520 can include one or more interconnection structures 522 embedded in a dielectric layer for electrically connecting the one or more peripheral circuits to the array device above the first substrate 570. The one or more interconnection structures 522 can include any suitable conductive structures including, but not limited to, contacts, single-layer/multi-layer vias, conductive layer(s), plugs, pads, and/or any other suitable conductive structures that are made by conductive materials including, but not limited to, W, Co, Cu, Al, doped silicon, silicides, or any combination thereof. Dielectric layer of peripheral interconnection layer 520 can have a single-layer structure or a multi-layer structure and include dielectric materials including, but not limited to, silicon oxide, silicon nitride, silicon oxynitride, doped silicon oxide, or any combination thereof.

Second chip 500B can include a second bonding interface 524, which can be a lateral top surface extending laterally in the X direction (the lateral direction, e.g., WL direction or BL direction). In some embodiments, first bonding surface 534 of first chip 500A is bonded to second bounding surface 524 of second chip 500B. That is, peripheral interconnection layer 520 and array interconnection 530 can be bonded in a face-to-face manner. As such, first chip 500A and second chip 500B can be bonded at bonding interface 555 to form 3D memory device 500C, as shown in FIG. 5B.

Bonding interface 555 is between peripheral interconnection layer 520 and array interconnection 530. That is, bonding interface 555 can be between two dielectric layers, such as between a silicon nitride layer and a silicon oxide layer. Bonding interface 555 can also be between two conductive layers, such as between two metal (e.g., Cu) layers. In some embodiments, the bonding interface includes both the interface between dielectric layers and the interface between conductive layers. In some embodiments, one or more interconnection structures 532 in first chip 500A and one or more interconnection structures 522 in second chip 500B can be contacted with each other at bonding interface 555 for electrically interconnecting one or more TACs 526 in first chip 500A and the peripheral circuits in second chip 500B.

Bonding interface 555 can be formed by chemical bonds between the dielectric layers and/or the conductive layers on both sides of the bonding interface, e.g. first bonding surface 534 and second surface 524 as shown in FIG. 5A. Bonding interface 555 can be formed by physical interaction (e.g., inter-diffusion) between the dielectric layers and/or the conductive layers on both sides of the bonding interface. In some embodiments, the bonding interface is formed after a plasma treatment or a thermal treatment of the surfaces from both sides of the bonding interface prior to the bonding process.

By using the bonding through contact hole on the back side of the first substrate, a pad layer of the interconnection structures can be formed on the back surface of the first substrate corresponding to the array device. Since the pad layer is formed on the back surface of the first substrate rather than the surrounding regions of the first substrate, the size of the 3D memory device can be reduced and the integration degree of the 3D memory device can be increased.

Figure 6A:
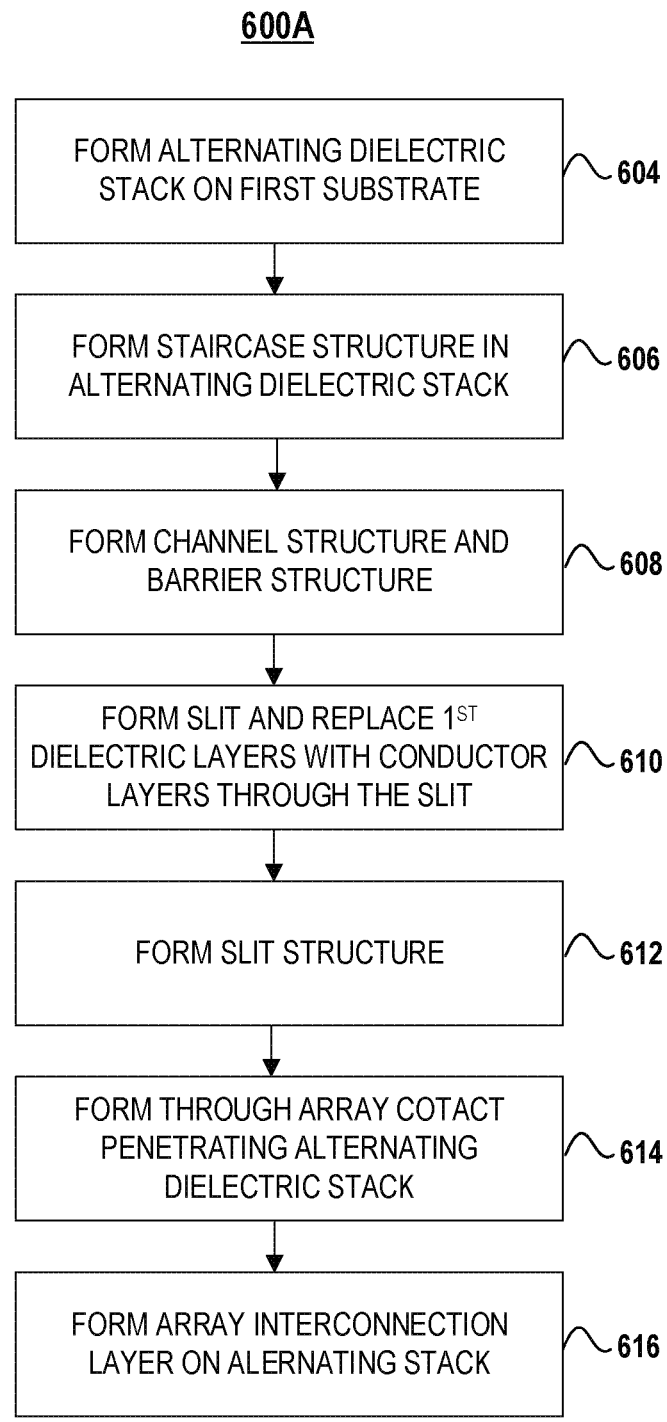
FIGS. 6A-6B are flowcharts of an exemplary method for forming a 3D memory device, according to some embodiments of the present disclosure.
Figure 6B:
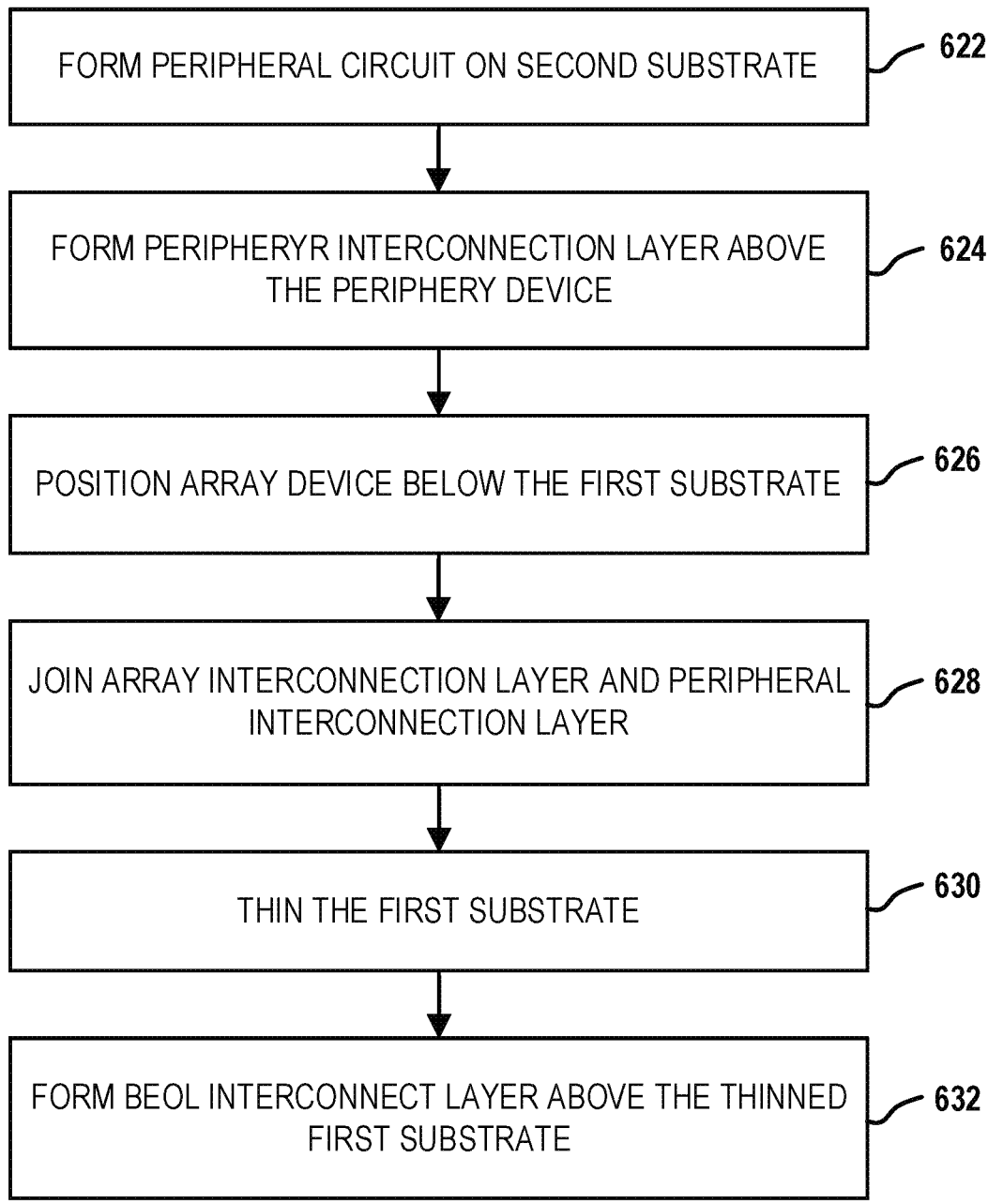
Figure 7A:
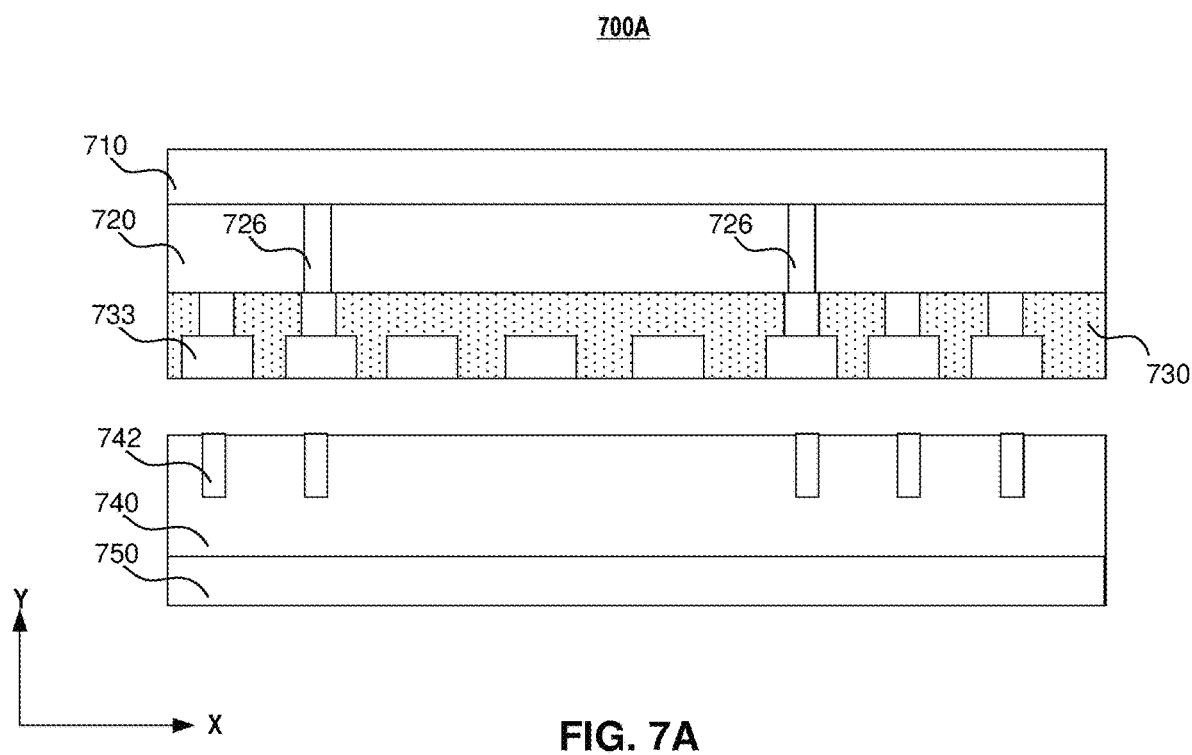
FIGS. 7A-7C illustrate schematic cross-sectional views of an exemplary 3D memory device at certain fabricating stages of the method shown in FIGS. 6A-6B according to some embodiments of the present disclosure.
Figure 7B:
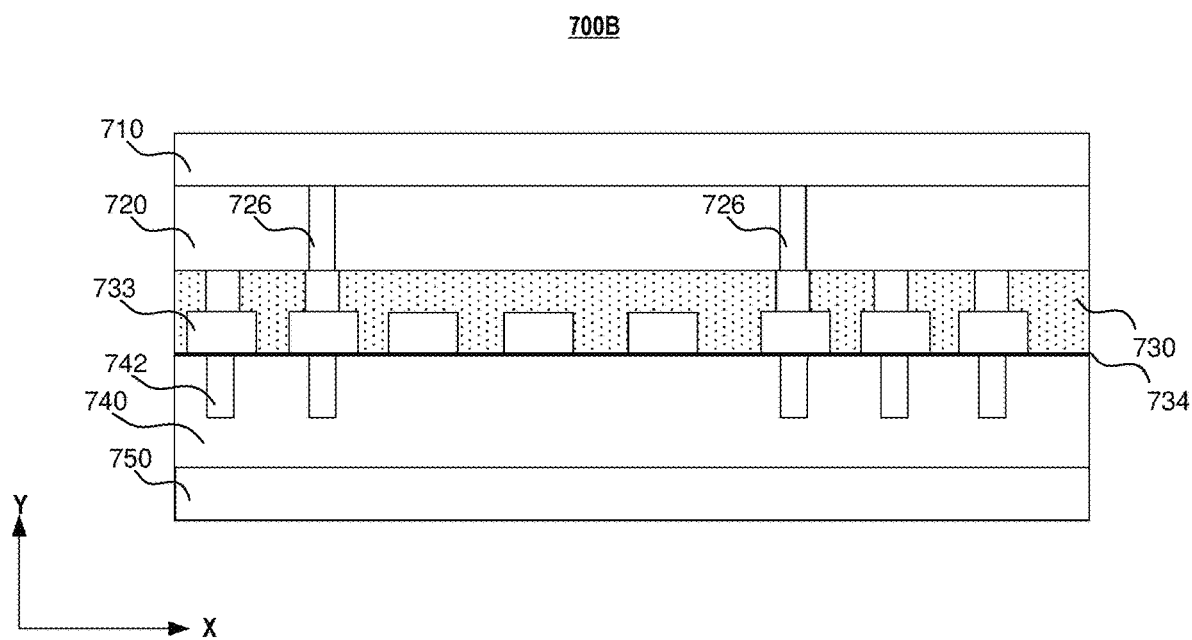
Figure 7C:
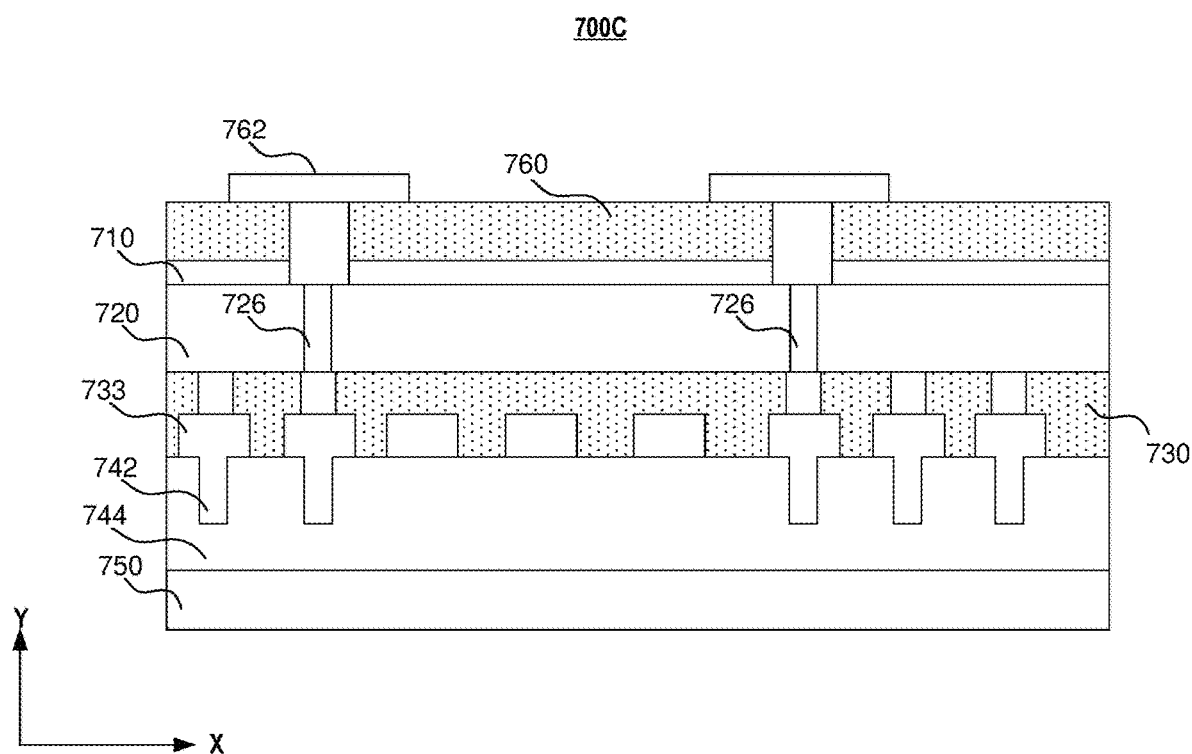

Referring to FIGS. 6A-6B, schematic flowcharts of an exemplary method for forming a 3D memory device are illustrated according to some embodiments of the present disclosure. It should be understood that the operations shown in FIGS. 6A-6B are not exhaustive and that other operations can be performed as well before, after, or between any of the illustrated operations. FIGS. 7A-7C illustrate schematic cross-sectional views of another exemplary 3D memory device at certain fabricating stages of the method shown in FIGS. 6A-6B according to some other embodiments of the present disclosure.

Referring to FIG. 6A, a flowchart of an exemplary method 600A for forming an array device and an array interconnection layer is illustrated according to some embodiments. As shown in FIG. 6A, method 600A starts at operation 604, in which an alternating dielectric stack is formed on a first substrate. In some embodiments, the first substrate can be any suitable semiconductor substrate having any suitable structure, such as a monocrystalline single-layer substrate, a polycrystalline silicon (polysilicon) single-layer substrate, a polysilicon and metal multi-layer substrate, etc.

A plurality of dielectric layer pairs (also referred to herein as an "alternating dielectric stack") can be formed on the first substrate. The alternating dielectric stack can include an alternating stack of a first dielectric layer and a second dielectric layer that is different from first dielectric layer. In some embodiments, each dielectric layer pair includes a layer of silicon nitride and a layer of silicon oxide. In some embodiments, there are more layers than the dielectric layer pairs made of different materials and with different thicknesses in alternating dielectric stack. The alternating dielectric stack can be formed by one or more thin film deposition processes including, but not limited to, CVD, PVD, ALD, or any combination thereof.

Method 600A proceeds to operation 606, in which a staircase structure is formed at one or more edges of the alternating dielectric stack. In some embodiments, a trim-etch process can be performed on at least one side (in the lateral direction) of alternating dielectric stack to form the staircase structure with multiple levels. Each level can include one or more dielectric layer pairs with alternating first dielectric layer and second dielectric layer.

Method 600A proceeds to operation 608, a plurality of channel structures and one or more barrier structures are formed. Each channel structure and each barrier structure can extend vertically through the alternating dielectric stack.

In some embodiments, fabrication processes to form channel structure include forming a channel hole that extends vertically through alternating dielectric stack by, for example, wet etching and/or dry etching. In some embodiments, fabrication processes to form channel structure further include forming semiconductor channel and memory film between semiconductor channel and the dielectric layer pairs in alternating dielectric stack. Semiconductor channel can include semiconductor materials, such as polysilicon. Memory film can be a composite dielectric layer, such as a combination of a tunneling layer, a storage layer, and a blocking layer.

The tunneling layer can include dielectric materials including, but not limited to, silicon oxide, silicon nitride, silicon oxynitride, or any combination thereof. Electrons or holes from the semiconductor channel can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer, such as an aluminum oxide ($Al_2O_3$) layer. Semiconductor channel and memory film can be formed by one or more thin film deposition processes, such as ALD, CVD, PVD, any other suitable processes, or any combination thereof.

In some embodiments, fabrication processes to form barrier structure are similarly and simultaneously performed as the fabrication processes to form channel structure, thereby reducing fabrication complexity and cost. In some other embodiments, channel structure and barrier structure are formed in different fabrication steps so that barrier structure can be filled with materials different from the materials filling channel structure.

In some embodiments, fabrication processes to form a barrier structure include forming a trench that extends vertically through alternating dielectric stack by, for example, wet etching and/or dry etching. After the trench is formed through alternating dielectric stack, one or more thin film deposition processes can be performed to fill the trench with dielectric materials including, but not limited to, silicon oxide, silicon nitride, silicon oxynitride, silicon oxide/silicon nitride/silicon oxide (ONO), aluminum oxide ($Al_2O_3$), etc., or any combination thereof.

By forming the one or more barrier structures, alternating dielectric stack can be separated into two types of regions: one or more inside regions each enclosed laterally by at least a barrier structure (in conjunction with the edge(s) of alternating dielectric stack in some embodiments) and an outside region in which channel structures and/or word line contacts can be formed. It is note that, each inside region corresponds to an opening in the first substrate.

In some embodiments, at least one inside region can be used to form a BL TAC structure as described above in connection with FIG. 2. As such, the barrier structure enclosing such inside region can include two parallel barrier walls that extend along WL direction.

In some embodiments, at least one inside region can be used to form a BL TAC structure as described above in connection with FIG. 3A or 3B. As such, the barrier structure enclosing such inside region can have a rectangular shape. A width of the barrier structure in BL direction can be larger than a distance between two neighboring slit structures formed in subsequent processes.

In some embodiments, at least one inside region can be used to form a BL TAC structure as described above in connection with FIG. 3C or 3D. As such, the barrier structure enclosing such inside region can have a rectangular shape. A width of the barrier structure in BL direction can be less than a distance between two neighboring slit structures formed in subsequent processes.

In some embodiments, at least one inside region can be used to form a SS TAC structure as described above in connection with FIG. 4A. As such, the barrier structure for separating such inside region can have a rectangular shape with one open edge facing the edge of the staircase structure. A width of the barrier structure in BL direction can be larger than a distance between two neighboring slit structures formed in subsequent processes.

In some embodiments, at least one inside region can be used to form a SS TAC structure as described above in connection with FIG. 4B. As such, the barrier structure for separating such inside region can have a rectangular shape with one open edge facing the edge of the staircase structure. A width of the barrier structure in BL direction can be less than a maximum distance between two neighboring slit structures formed in staircase region in subsequent processes.

In some embodiments, dummy channel structures can be formed simultaneously with channel structures. The dummy channel structures can extend vertically through the alternating layer stack and can be filled with the same materials as those in channel structures. Different from channel structures, contacts are not formed on the dummy channel structures to provide electrical connections with other components of the 3D memory device. Thus, the dummy channel structures cannot be used for forming memory cells in the 3D memory device.

Method 600A proceeds to operation 610, in which a plurality of slits are formed, and first dielectric layers in a portion of the alternating dielectric stack are replaced with conductive layers through the plurality of slits. For example, multiple parallel slit extending in WL direction can be first formed by wet etching and/or dry etching of dielectrics (e.g., silicon oxide and silicon nitride) through alternating dielectric stack in the outside area. In some embodiments, doped regions are then formed in the first substrate under each slit by, for example, ion implantation and/or thermal diffusion through the slits. It is understood that doped regions can be formed in an earlier fabrication stage, for example, prior to the formation of the slits, according to some embodiments.

In some embodiments, the formed slits are used for the gate replacement process (also known as the "word line replacement" process) that replaces, in the outside area of alternating dielectric stack, first dielectric layers (e.g., silicon nitride) with conductive layers (e.g., W). It is noted that, the gate replacement occurs only in the outside area of alternating dielectric stack, but not in the inside area, due to the formation of barrier structure. Barrier structure can prevent the etching of first dielectric layers (e.g., silicon nitride) in the inside area of alternating dielectric stack because barrier structure is filled materials that cannot be etched by the etching step of the gate replacement process.

As a result, after the gate replacement process, alternating dielectric stack in the outside region becomes alternating conductor/dielectric stack. The replacement of first dielectric layers with conductive layers can be performed by wet etching first dielectric layers (e.g., silicon nitride) selective to second dielectric layers (e.g., silicon oxide) and filling the structure with conductive layers (e.g., W). Conductive layers can be filled by PVD, CVD, ALD, any other suitable process, or any combination thereof. Conductive layers can include conductive materials including, but not limited to, W, Co, Cu, Al, polysilicon, silicides, or any combination thereof. The formed alternating conductor/dielectric stack and remaining alternating dielectric stack can constitute an alternating stack.

Method 600A proceeds to operation 612, in which slit structures are formed by filling (e.g., depositing) conductive materials into the slits by PVD, CVD, ALD, any other suitable process, or any combination thereof. Slit structures can include conductive materials including, but not limited to, W, Co, Cu, Al, polysilicon, silicides, or any combination thereof. In some embodiments, a dielectric layer (e.g., a silicon oxide layer) is formed first between the conductive materials of slit structure and conductive layers surrounding slit structure in alternating conductor/dielectric stack for insulation purposes. The lower end of slit structure can be in contact with doped region.

Method 600A proceeds to operation 614, in which a plurality of TACs are formed through alternating dielectric stack. TACs can be formed in the one or more inside regions by first etching vertical openings (e.g., by wet etching and/or dry etching), followed by filling the openings with conductive materials using ALD, CVD, PVD, any other suitable processes, or any combination thereof. The conductive materials used for filling the local contacts can include, but are not limited to, W, Co, Cu, Al, polysilicon, silicides, or any combination thereof. In some embodiments, other conductive materials are also used to fill the openings to function as a barrier layer, an adhesion layer, and/or a seed layer.

TACs can be formed by etching through the entire thickness of alternating dielectric stack. Because alternating dielectric stack includes alternating layers of dielectrics, such as silicon oxide and silicon nitride, the openings of TACs can be formed by deep etching of dielectric materials (e.g., by deep reactive-ion etching (DRIE) process or any other suitable anisotropic etch process). In some embodiments, although TACs are formed after the gate replacement, by reserving an area of alternating dielectric stack that is not affected by the gate replacement process (not turned into alternating conductor/dielectric stack), TACs are still formed through dielectric layers (without passing through any conductive layers), which simplifies the fabrication process and reduces the cost.

Method 600A proceeds to operation 616, in which an array interconnection layer is formed on the alternating stack. The array interconnection layer can be used to transfer electrical signals between the TACs and other parts of the 3D memory devices, such as the peripheral circuits. In some embodiments, fabrication processes to form the array interconnection layer include forming a dielectric layer, followed by forming a plurality of interconnection structures. One or more of the interconnection structures can be in contact with the TACs respectively.

The dielectric layer can include one or more layers of dielectric materials such as silicon oxide, silicon nitride, silicon oxynitride, or any combination thereof. The interconnection structures can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof.

In some embodiments, fabrication processes to form the interconnection structures include forming openings in the dielectric layer, followed by filling the openings with conductive materials. The openings in the dielectric layer can be filled with conductive materials by ALD, CVD, PVD, any other suitable processes, or any combination thereof. In some embodiments, fabrication processes to form the interconnection structures further include forming one or more conductive layers and one or more contact layer in the dielectric layer. The conductive layers and the conductor contact layers can be formed by any suitable known BEOL methods.

Referring to FIG. 6B, a flowchart of an exemplary method 600B for forming a peripheral circuit and a peripheral interconnection layer is illustrated according to some embodiments. As shown in FIG. 6B, method 600B starts at operation 622, in which a peripheral circuit is formed on a second substrate. In some embodiments, the second substrate can be any suitable semiconductor substrate having any suitable structure, such as a monocrystalline single-layer substrate, a polycrystalline silicon (polysilicon) single-layer substrate, a polysilicon and metal multi-layer substrate, etc.

The peripheral circuit can include any suitable peripheral devices formed on the second substrate and any suitable interconnection circuits between the peripheral devices. One or more peripheral devices and/or interconnection circuits can be formed by a plurality of processing steps including, but not limited to, photolithography, dry/wet etch, thin film deposition, thermal growth, implantation, CMP, or any combination thereof.

Method 600B proceeds to operation 624, in which a peripheral interconnection layer is formed on the peripheral circuit. The peripheral interconnection layer can include a dielectric layer above the peripheral circuit and one or more interconnection structures formed in the dielectric layer. The dielectric layer can include one or more layers of dielectric materials such as silicon oxide, silicon nitride, silicon oxynitride, or any combination thereof. The interconnection structures can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof.

In some embodiments, the interconnection structures can be formed by using any suitable known middle-end-of-line (MEOL) method. For example, fabrication processes to form the interconnection structures can include forming openings in the dielectric layer, followed by filling the openings with conductive materials. The openings in the dielectric layer can be filled with conductive materials by ALD, CVD, PVD, any other suitable processes, or any combination thereof. Further, fabrication processes to form the interconnection structures can include forming one or more conductive layers and one or more contact layer in the dielectric layer. The conductive layers and the conductor contact layers can include conductor materials deposited by one or more thin film deposition processes including, but not limited to, CVD, PVD, ALD, electroplating, electroless plating, or any combination thereof. Fabrication processes to form the conductive layer and contact layers can also include photolithography, CMP, wet/dry etch, or any combination thereof.

As shown in FIG. 7A, dielectric layer 740 is formed on the second substrate 750, while a plurality of interconnection structures 742 are formed in the dielectric layer 740. It is noted that, the peripheral circuit is not shown in FIG. 7A. The plurality of interconnection structures 742 are electrically in contact with the peripheral circuit.

Method 600B proceeds to operation 626, in which the array device (and the array interconnection layer) is positioned (or otherwise disposed) below the first substrate (e.g., by flipping the first substrate upside down), and the array interconnection layer is aligned with the peripheral interconnection layer. As illustrated in FIG. 7A, array interconnection layer 730 can be placed below second silicon substrate 710. TACs 726 can be penetrate alternating stack 720. In some embodiments, aligning array interconnection layer 730 with peripheral interconnection layer 740 is performed by aligning interconnection structures 733 in array interconnection layer 730 with interconnection structures 742 in peripheral interconnection layer 740. As a result, interconnection structures 733 can electrically contact interconnection structures 742 when the array device is joined with the peripheral circuit in the subsequent operation.

Method 600B proceeds to operation 628, as illustrated in FIG. 6B, in which the array interconnection layer is joined with the peripheral interconnection layer. The array interconnection layer can be joined with the peripheral interconnection layer by flip-chip bonding the first and second substrates. In some embodiments, the array interconnection layer and the peripheral interconnection layer are joined by hybrid bonding of the first substrate and the second substrate in a face-to-face manner, such that the array interconnection layer is above and in contact with the peripheral interconnection layer in the resulting 3D memory device.

Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. As illustrated in FIG. 7B, array interconnection layer 730 can be joined with peripheral interconnection layer 740, thereby forming a bonding interface 734.

In some embodiments, a treatment process can be used to enhance the bonding strength between array interconnection layer 730 and peripheral interconnection layer 740 before or during the joining process of the two interconnection layers. In some embodiments, each of dielectric layers in the array interconnection layer 730 and peripheral interconnection layer 740 includes silicon oxide or silicon nitride. For example, a plasma treatment can be used to treat the surfaces of array interconnection layer 730 and peripheral interconnection layer 740 so that the surfaces of the two interconnection layers form chemical bonds between the two dielectric layers. As another example, a wet process can be used to treat the surfaces of array interconnection layer 730 and peripheral interconnection layer 740 so that the surfaces of the two interconnection layers form preferable chemical bonds to enhance the bonding strength between two dielectric layers. As yet another example, a thermal process that can be performed at a temperature from about 250° C. to about 600° C. (e.g., from 250° C. to 600° C.). The thermal process can cause inter-diffusion between interconnection structures 733 and 742. As a result, corresponding interconnection structures 733 and 742 can be inter-mixed after the joining process. In some embodiments, interconnection structures 733 and 742 can each includes Cu.

Method 600B proceeds to operation 630, as illustrated in FIG. 6B, in which the first substrate is thinned so that the thinned first substrate serves as a semiconductor layer above the array device (e.g., the NAND strings). As illustrated in FIG. 7C, the thinned first substrate 710 can be a single crystalline silicon layer. In some embodiments, after the thinning process, single crystalline silicon layer 710 has a thickness between about 5 nm and about 50 µm (e.g., 5 nm, 50 nm, 500 nm, 5 µm, 50 µm, any range bounded on the lower end by any of these values, or in any range defined by any two of these values). First substrate 710 can be thinned by processes including, but not limited to, wafer grinding, dry etch, wet etch, CMP, any other suitable processes, or any combination thereof.

Method 600B proceeds to operation 632, as illustrated in FIG. 6B, in which a BEOL interconnection layer can be formed above the semiconductor layer. As illustrated in FIG. 7C, a BEOL interconnection layer is formed above first substrate 710. BEOL interconnection layer can include a dielectric layer 760 overlay the first substrate 710, and a plurality of interconnection structures 762 in the dielectric layer 760.

In some embodiments, fabricating process of interconnection structures 762 can include separate process steps for forming one or more contact layers, conductive layers, and/or pad layers in a dielectric layer. Dielectric layer 760 can be a combination of multiple dielectric layers formed at separate process steps. Interconnection structures 762 can include conductor materials including, but not limited to, W, Co, Cu, Al, doped silicon, silicides, or any combination thereof. In some embodiments, fabricating process of interconnection structures 762 further includes forming one or more openings in first substrate 710. The one or more openings can corresponding to one or more through array contact TAC structures (e.g., word line (WL) TAC structure as shown in FIG. 2, bit line (BL) TAC structures as shown in FIGS. 3A-3D, and staircase structure (SS) TAC structures as shown in FIGS. 4A-4B). As such, one or more interconnection structures 762 penetrate dielectric layer 760 and first substrate 710 and are electrically connected to TACs 726 respectively. Therefore, TACs 726 can be used to electrically interconnect external circuits or devices to transfer electrical signals between the joined array and/or peripheral circuits and the external circuits or devices.

Various embodiments in accordance with the present disclosure provide a 3D memory device with smaller die size, higher device density, and improved performance compared with other 3D memory devices. By vertically stacking an array device and BEOL interconnect above a peripheral circuit, the density of 3D memory devices can be increased. By providing through array contact (TAC) structures for a memory array, vertical interconnects between the stacked array device and peripheral device (e.g., for power bus and metal routing) can be realized to reduce metal levels and shrink die size. In some embodiments, the through array contact structures disclosed herein are formed through a stack of alternating dielectric layers, which can be more easily etched to form through holes therein compared with a stack of alternating conductor and dielectric layers, thereby reducing the process complexity and manufacturing cost.

Accordingly, one aspect of the present discloses a three-dimensional (3D) NAND memory device including an alternating layer stack disposed on a first substrate. The alternating layer stack can include a first region including an alternating dielectric stack comprising a plurality of dielectric layer pairs, and a second region including an alternating conductor/dielectric stack comprising a plurality of conductor/dielectric layer pairs. The 3D NAND memory device further includes a barrier structure extending vertically through the alternating layer stack to laterally separate the first region from the second region, and a plurality of through array contacts in the first region. Each through array contact extends vertically through the alternating dielectric stack. The 3D NAND memory device further includes an array interconnection layer disposed on the alternating layer stack at an end of the alternating layer stack opposite to the first substrate. The array interconnection layer includes at least one first interconnection structure that is electrically connected with at least one through array contact. The 3D NAND memory device further includes a peripheral circuit formed on a second substrate, and a peripheral interconnection layer on the at least one peripheral circuit, and including at least one second interconnection structure that is electrically connected with the peripheral circuit. The array interconnection layer is bonded on the peripheral interconnection layer, such that the peripheral circuit is electrically connected with the at least one of the plurality of through the at least one first interconnection structure and the at least one second interconnection structure.

The barrier structure comprises silicon oxide and silicon nitride. Each of the plurality of dielectric layer pairs comprises a silicon oxide layer and a silicon nitride layer, and each of the plurality of conductor/dielectric layer pairs comprises a metal layer and a silicon oxide layer. A number of the plurality of dielectric layer pairs is at least 32, and a number of the plurality of conductor/dielectric layer pairs is at least 32.

The 3D NAND memory device further includes a plurality of slit structures each extending vertically through the alternating conductor/dielectric stack and laterally along a word line direction to divide the alternating conductor/dielectric stack into a plurality of memory fingers.

In some embodiments, the barrier structure laterally extends along the word line direction. The first region is separated by the barrier structure from the second region and sandwiched between two neighboring slit structures.

In some embodiments, the barrier structure laterally extends along a bit line direction that is different than the word line direction to laterally separate the first region from the second region. The bit line direction can be perpendicular to the word line direction.

In some embodiments, a width of the first region enclosed by the barrier structure in the bit line direction can be larger than a distance between two neighboring slit structures.

In some embodiments, the first region enclosed by the barrier structure can be sandwiched between two top selective gate staircase regions in the word line direction. At least top two layers of the alternating conductor/dielectric stack that is away from the first substrate in each top selective gate staircase region can have a staircase structure. At least one conductive layer on the staircase structure in the top selective gate staircase regions and configured to interconnect top select gates that are above the alternating conductor/dielectric stack in the second region and on both sides of first region enclosed by the barrier structure in the word line direction.

The 3D NAND memory device further includes at least two first regions enclosed by corresponding barrier structures, each first region extending parallel along the bit line direction.

The 3D NAND memory device further includes a plurality of barrier structures to enclose a plurality of first regions from the second region, such that the plurality of first regions are aligned in the bit line direction. Each of the plurality of first regions is sandwiched between two neighboring slit structures in the bit line direction. In some embodiments, the plurality of first regions are aligned so as to form at least two columns in the bit line direction.

In some embodiments, at least one silt structure, that is sandwiched by two neighboring barrier structures in the bit line direction, includes a gap and the at least one silt structure is configured to interconnect word lines of neighboring ones of the plurality of memory fingers.

In some embodiments, the first region is separated by the barrier structure from a staircase structure on an edge of the alternating conductor/dielectric layer stack along the bit line direction. An opening of the barrier structure is at an edge of the alternating layer stack along the bit line direction.

In some embodiments, a width of the first region in the bit line direction is larger than a distance between two neighboring slit structures.

In some embodiments, a width of the first region in the bit line direction is less than a maximum distance between two neighboring slit structures in the staircase structure on the edge of the alternating layer stack along the bit line direction.

The 3D memory device can further include a plurality of dummy channel structures adjacent to the barrier structure, each dummy channel structure extending vertically through the alternating conductor/dielectric stack.

Another aspect of the present disclosure provides a method for forming a three-dimensional (3D) NAND memory device. The method can include: forming, on a first substrate, an alternating dielectric stack comprising a plurality of dielectric layer pairs, each of the plurality of dielectric layer pairs comprising a first dielectric layer and a second dielectric layer different from the first dielectric layer; forming at least one barrier structure each extending vertically through the alternating dielectric stack, such that the at least one barrier structure separates the alternating dielectric stack into at least one first region enclosed laterally by at least the barrier structure, and a second region; forming a plurality of slits, and replacing, through the slits, first dielectric layers in the second portion of the alternating dielectric stack with conductor layers to form an alternating conductor/dielectric stack comprising a plurality of conductor/dielectric layer pairs; depositing a conductive material into the slits to form a plurality of slit structures; forming a plurality of through array contacts in the first region, each through array contact extending vertically through the alternating dielectric stack; forming an array interconnection layer on the alternating layer stack and including at least one first interconnection structure that is electrically connected with at least one through array contact; and bonding the array interconnection layer to a peripheral interconnection layer on a second substrate and including at least one second interconnection structure that is electrically connected with a peripheral circuit formed on the second substrate, such that the peripheral circuit is electrically connected with the at least one of the plurality of through the at least one first interconnection structure and the at least one second interconnection structure.

The method can further include: prior to bonding the array interconnection layer to the peripheral interconnection layer, forming the peripheral circuit on the second substrate; forming the peripheral interconnection layer on the peripheral circuit, such that the at least one second interconnect structure in the peripheral interconnection layer is electrically connected to the peripheral circuit; and disposing the array interconnection layer and the peripheral interconnection layer, such that the at least one first interconnection structure corresponds to the at least one second interconnection structure respectively.

The method can further include: prior to forming the slits, forming a plurality of doped regions in the first substrate, so as to contact each slit structure with a corresponding doped region.

The method can further include forming the plurality of slit structures laterally to extend along a word line direction to divide the alternating conductor/dielectric stack into a plurality of memory fingers.

The method can further include forming two parallel barrier structures laterally to extend along the word line direction, such that the first region is separated by the two parallel barrier structure from the second region and sandwiched between two neighboring slit structures.

The method can further include forming the barrier structure laterally extending along a bit line direction that is different than the word line direction to laterally separate the first region from the second region.

The method can further include forming the barrier structure to laterally extend along the bit line direction that is perpendicular to the word line direction.

The method can further include forming the barrier structure such that a width in the bit line direction of the first region enclosed by the barrier structure is larger than a distance between two neighboring slit structures.

The method can further include forming a staircase structure in the alternating dielectric stack adjacent to the barrier structure.

The method can further include forming at least one conductive layer on the staircase structure adjacent to the barrier structure to interconnect top select gates that are above the alternating conductor/dielectric stack in the second region, and on both sides of first region enclosed by the barrier structure in the word line direction.

The method can further include forming at least two barrier structures to enclose at least two first regions extending parallel along the bit line direction.

The method can further include forming a plurality of barrier structures to enclose a plurality of first regions from the second region, the plurality of first regions are aligned in the bit line direction, such that each of the plurality of first regions is sandwiched between two neighboring slit structures in the bit line direction.

The method can further include forming the plurality of barrier structures such that the plurality of first regions enclosed by the plurality of barrier structures are aligned as at least two columns in the bit line direction.

The method can further include forming a gap in the at least one silt structure that is sandwiched by two neighboring barrier structures in the bit line direction to for interconnect word lines of neighboring memory fingers.

The method can further include forming the barrier structure to separate the first region in the staircase structure at the edge of the alternating stack. An opening of the barrier structure can be at the edge of the alternating layer stack along a bit line direction that is different than the word line direction.

The method can further include forming the barrier structure, such that a width of the first region in the bit line direction is larger than a distance between two neighboring slit structures.

The method can further include forming the barrier structure, such that a width of the first region in the bit line direction is less than a maximum distance between two neighboring slit structures in the staircase structure.

The method can further include forming a plurality of dummy channel structures adjacent to the barrier structure, each dummy channel structure extending vertically through the alternating conductor/dielectric stack.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
an alternating dielectric stack comprising a plurality of dielectric layer pairs arranged in a vertical direction;
an alternating conductor/dielectric stack comprising a plurality of conductor/dielectric layer pairs arranged in the vertical direction;
at least one through array contact extending through the alternating dielectric stack in the vertical direction and electrically connecting to an array interconnection layer in a first substrate;
a peripheral interconnection layer connecting to a peripheral circuit formed on a second substrate;
wherein the array interconnection layer is bonded on the peripheral interconnection layer, such that the peripheral circuit is electrically connected with at least one of the plurality of through array contacts.

2. The memory device of claim 1, further comprises:
a barrier structure laterally extends along a bit line direction to laterally separate the alternating dielectric stack from the alternating conductor/dielectric stack.

3. The memory device of claim 1, further comprises:
a plurality of channel structures extending through the alternating conductor/dielectric stack in the vertical direction.

4. The memory device of claim 3, further comprising:
a plurality of dummy channel structures each extending vertically through the alternating conductor/dielectric stack, wherein the plurality of dummy channel structures are located between the plurality of channel structures and the barrier structure.

5. The memory device of claim 1, wherein:
the array interconnection layer is disposed on a first side of the first substrate; and
the alternating dielectric stack and the alternating conductor/dielectric stack are disposed on a second side of the first substrate that is different from the first side of the first substrate.

6. The memory device of claim 1, wherein:
the array interconnection layer includes at least one first interconnection structure embedded in a first dielectric layer;
the peripheral interconnection layer includes at least one second interconnection structure embedded in a second dielectric layer; and
the peripheral circuit is electrically connected with the at least one of the plurality of through array contacts via the at least one first interconnection structure and the at least one second interconnection structure.

7. The memory device of claim 1, wherein:
each dielectric layer pair comprises a silicon oxide layer and a silicon nitride layer; and
each conductor/dielectric layer pair comprises a metal layer and a silicon oxide layer.

8. The memory device of claim 1, wherein:
a number of the plurality of dielectric layer pairs is at least 32; and
a number of the plurality of conductor/dielectric layer pairs is a least 32.

9. The memory device of claim 2, wherein:
the barrier structure laterally encloses the alternating dielectric stack, and is laterally enclosed by the alternating conductor/dielectric stack.

10. The memory device of claim 9, further comprising:
a plurality of barrier structures each laterally enclosing a corresponding alternating dielectric stack;
wherein the plurality of alternating dielectric stacks extend parallel along a bit line direction.

11. The memory device of claim 10, wherein:
the plurality of alternating dielectric stacks are aligned as at least two columns in the bit line direction.

12. The memory device of claim 9, further comprising:
a plurality of slit structures each extending vertically through the alternating conductor/dielectric stack and laterally along a word line direction.

13. The memory device of claim 12, wherein:
a width of the alternating dielectric stack in a bit line direction is larger than a distance between two neighboring slit structures.

14. A method for forming a three-dimensional (3D) memory device, comprising:
forming, on a first substrate, an alternating dielectric stack comprising a plurality of dielectric layer pairs, each dielectric layer pair comprising a first dielectric layer and a second dielectric layer different from the first dielectric layer;
forming a barrier structure extending vertically through the alternating dielectric stack and in laterally in a word line direction to separates the alternating dielectric stack into at least a first portion and a second portion;

replacing the first dielectric layers in the second portion of the alternating dielectric stack with conductor layers to form an alternating conductor/dielectric stack comprising a plurality of conductor/dielectric layer pairs;

forming at least one through array contact extending vertically through the first portion of the alternating dielectric stack;

forming an array interconnection layer in contact with the plurality of through array contacts; and bonding the array interconnection layer to a peripheral interconnection layer on a second substrate, such that at least one of the plurality of through array contacts is electrically connected with a peripheral circuit on the second substrate.

15. The method claim 14, before replacing the first dielectric layers in the second portion of the alternating dielectric stack with the conductor layers, further comprises:

forming a plurality of channel structures each extending vertically through the second portion of the alternating dielectric stack; and forming a plurality of dummy channel structures each extending vertically through the second portion of the alternating dielectric stack, wherein the plurality of dummy channel structures are located between the plurality of channel structures and the barrier structure.

16. The method of claim 13, wherein forming the barrier structure comprises:

forming the barrier structure to laterally enclose the first portion of the alternating dielectric stack.

17. The method of claim 16, further comprising:

forming a plurality of barrier structures each laterally enclosing corresponding portions of the alternating dielectric stack;

wherein the plurality portions of the alternating dielectric stacks extend parallel along a bit line direction.

18. The method of claims 14, before replacing the first dielectric layers in the second portion of the alternating dielectric stack with the conductor layers, further comprising:

forming a plurality of slit each extending vertically through the second portions of the alternating dielectric stack and laterally along a word line direction; and depositing a conductive material into the plurality of slits to form a plurality of slit structures.

19. The method of claim 18, wherein forming the barrier structure comprises:

forming the barrier structure extending along a bit line direction, such that a width of the first portion of the alternating dielectric stack in the bit line direction is larger than a distance between two neighboring slit structures.

20. The method of claim 14, wherein:

the alternating dielectric stack is formed on a first side of the first substrate; and the array interconnection layer is formed on a second side of the first substrate that is different from the first side of the first substrate.

* * * * *